United States Patent
Yamakawa et al.

(10) Patent No.: US 8,062,950 B2
(45) Date of Patent: Nov. 22, 2011

(54) METHOD OF MANUFACTURING SEMICONDUCTOR DEVICE WITH LOWER CAPACITOR ELECTRODE THAT INCLUDES ISLANDS OF CONDUCTIVE OXIDE FILMS ARRANGED ON A NOBLE METAL FILM

(75) Inventors: Koji Yamakawa, Tokyo (JP); Soichi Yamazaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/923,117

(22) Filed: Sep. 2, 2010

(65) Prior Publication Data

US 2010/0330769 A1    Dec. 30, 2010

Related U.S. Application Data

(62) Division of application No. 12/241,122, filed on Sep. 30, 2008, now Pat. No. 7,812,425.

(30) Foreign Application Priority Data

Oct. 5, 2007  (JP) ................................. 2007-261805
Oct. 5, 2007  (JP) ................................. 2007-261987

(51) Int. Cl.
*H01L 21/782*  (2006.01)

(52) U.S. Cl. .. 438/398; 438/608; 438/650; 257/E21.012
(58) Field of Classification Search ................... 257/534
See application file for complete search history.

(56) References Cited

U.S. PATENT DOCUMENTS

| | | |
|---|---|---|
| 6,194,228 B1 | 2/2001 | Fujiki et al. |
| 6,624,458 B2 | 9/2003 | Takamatsu et al. |
| 6,649,954 B2 | 11/2003 | Cross |
| 6,740,533 B2 | 5/2004 | Takamatsu et al. |
| 6,773,979 B2 | 8/2004 | Okuno et al. |
| 7,200,907 B2 | 4/2007 | Takakuwa et al. |
| 7,251,117 B2 | 7/2007 | Baniecki et al. |
| 7,273,791 B2 | 9/2007 | Basceri et al. |
| 7,297,999 B1 | 11/2007 | Wang |
| 2002/0179947 A1 | 12/2002 | Nasu et al. |
| 2006/0231880 A1 | 10/2006 | Yamakawa et al. |
| 2007/0228431 A1 | 10/2007 | Wang |

*Primary Examiner* — Stephen W Smoot
(74) *Attorney, Agent, or Firm* — Finnegan, Henderson, Farabow, Garrett & Dunner, L.L.P.

(57) ABSTRACT

A semiconductor device has a semiconductor substrate, and a capacitor which is provided on the upper side of the semiconductor substrate and composed of a lower electrode, an upper electrode and a dielectric film, the dielectric film being placed in between the lower electrode and the upper electrode, the lower electrode including a noble metal film, and a plurality of conductive oxide films formed in an islands arrangement on the noble metal film.

4 Claims, 25 Drawing Sheets

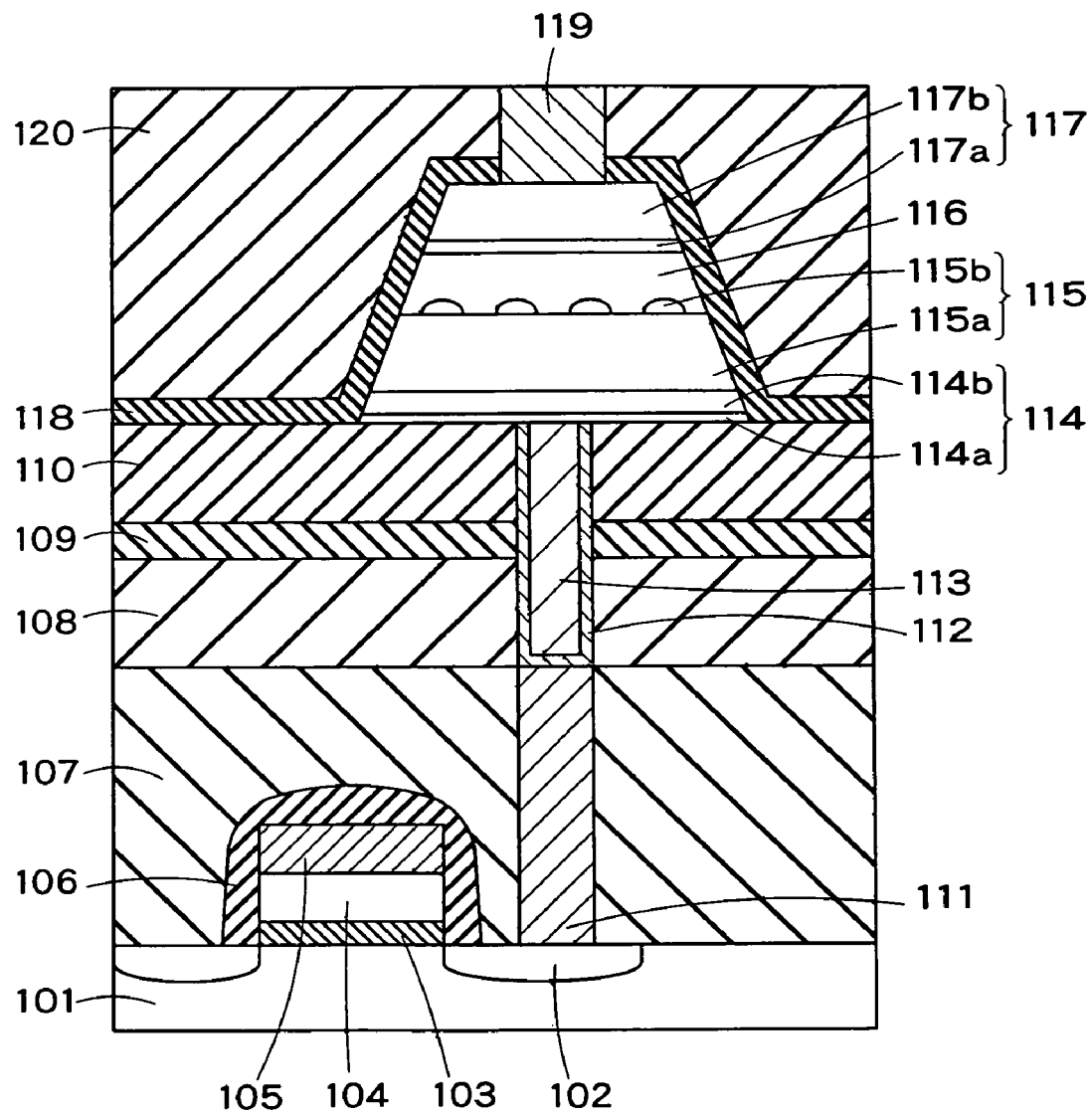
F I G. 1

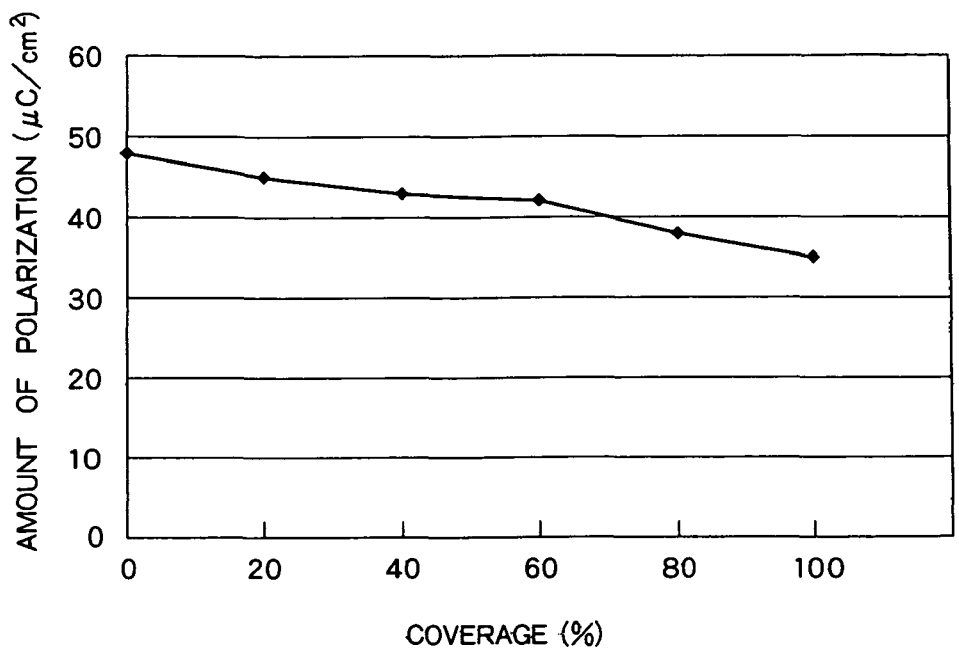
F I G. 2
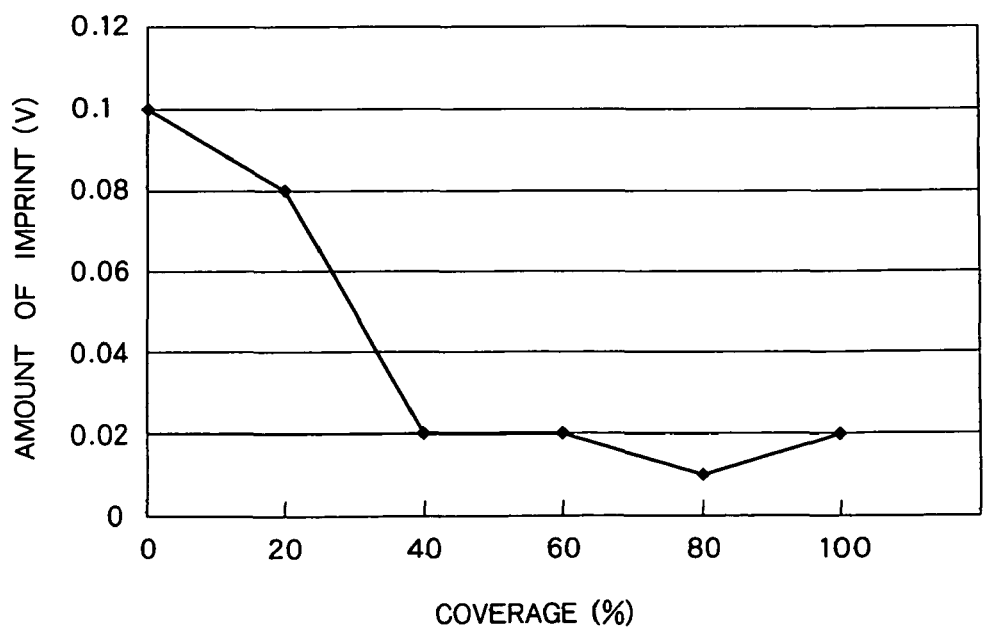
F I G. 3

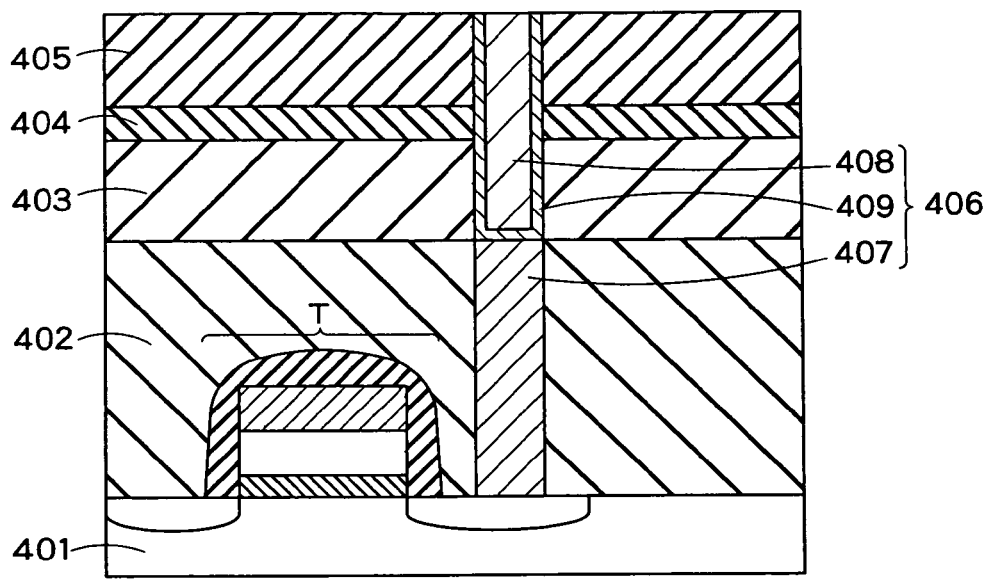
F I G. 4
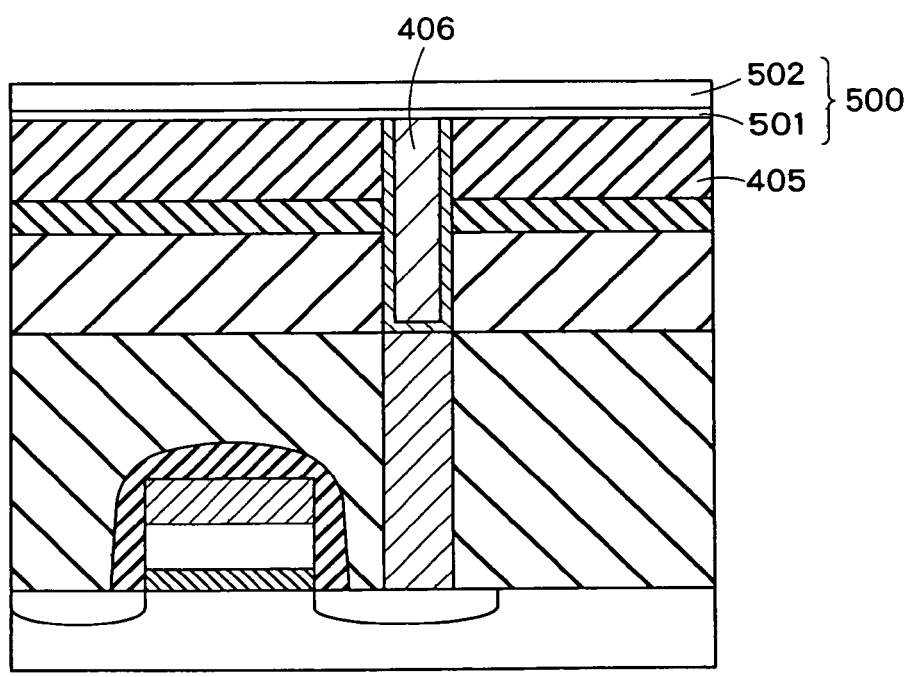
F I G. 5

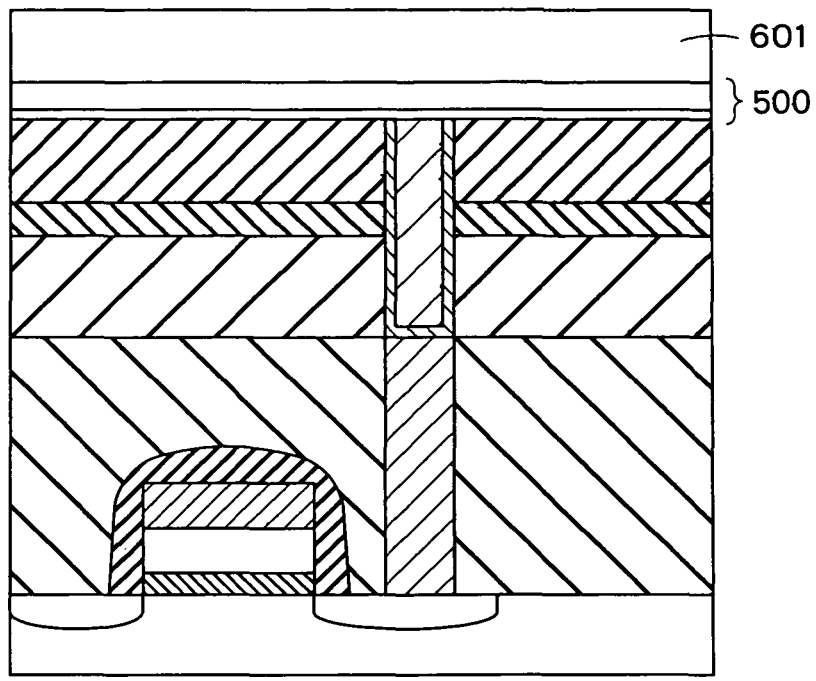
F I G. 6
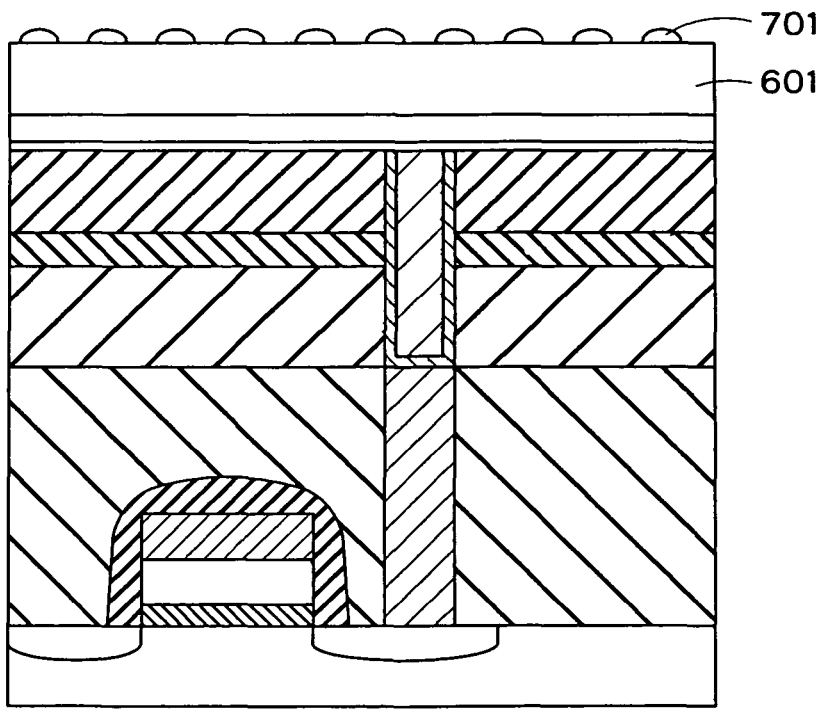
F I G. 7

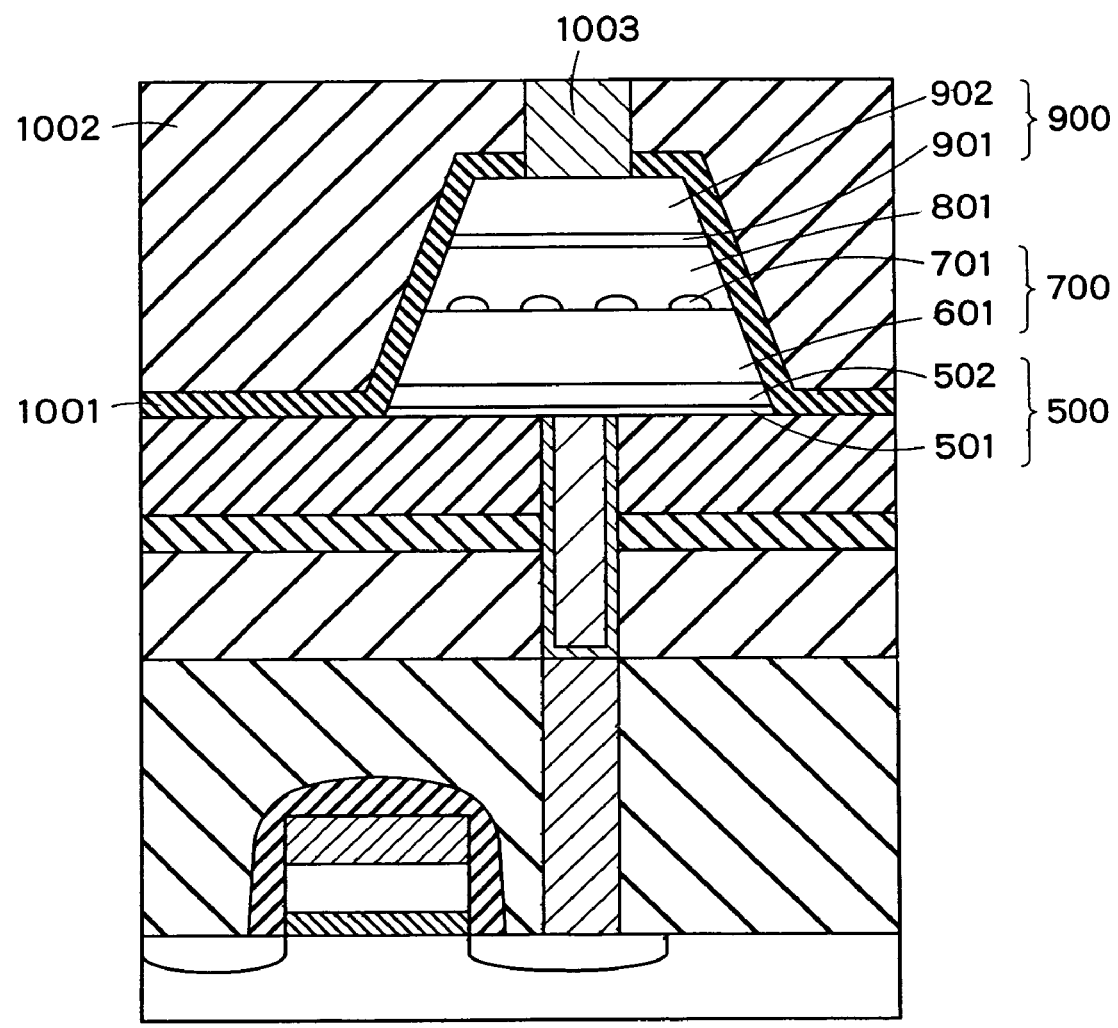
F I G. 10

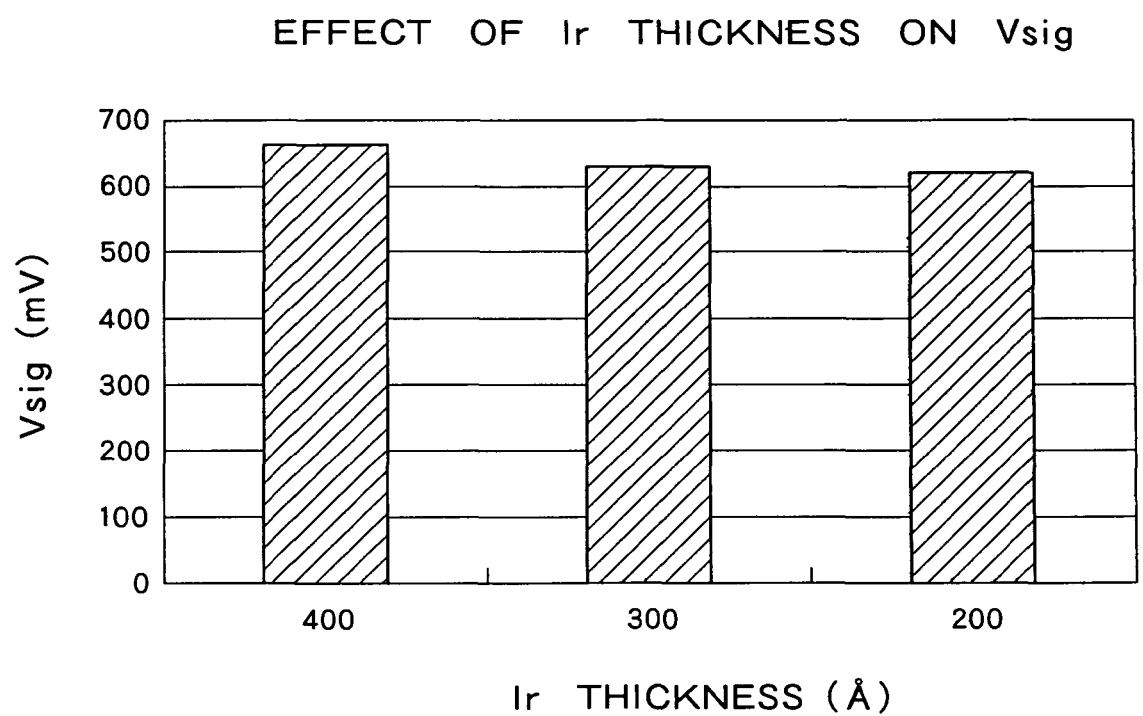
F I G. 12

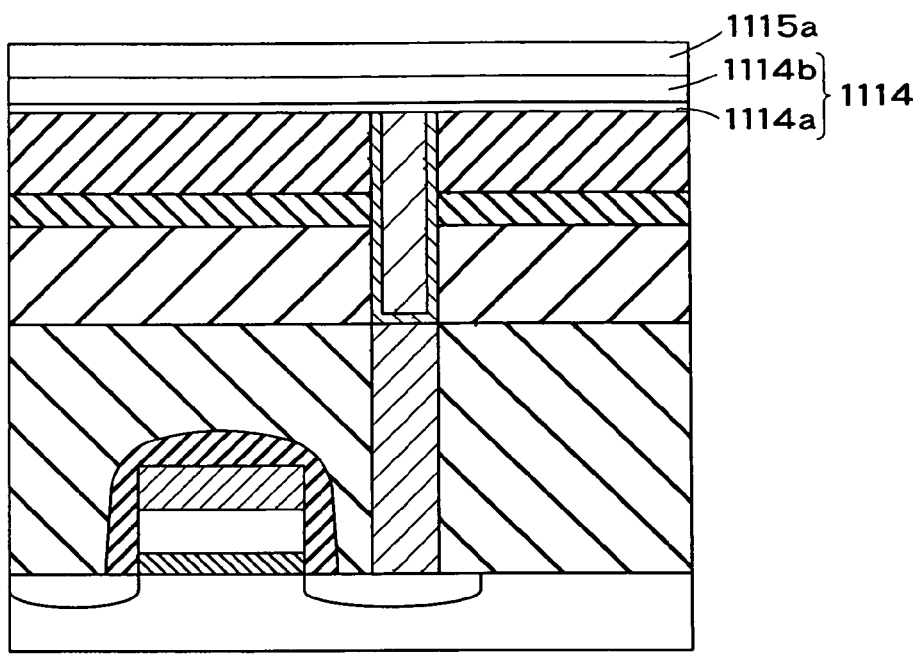
F I G. 15
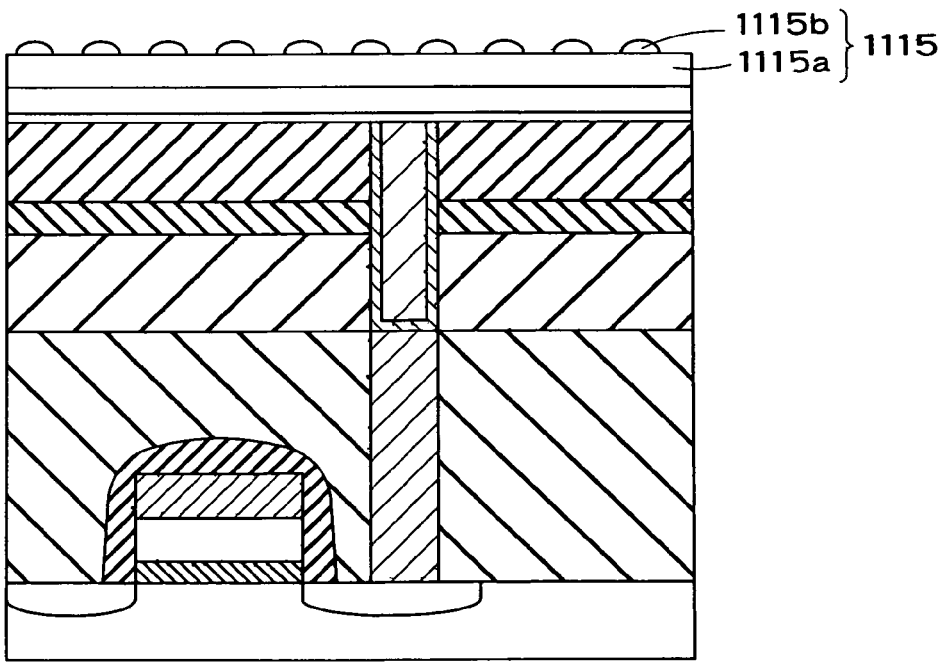
F I G. 16

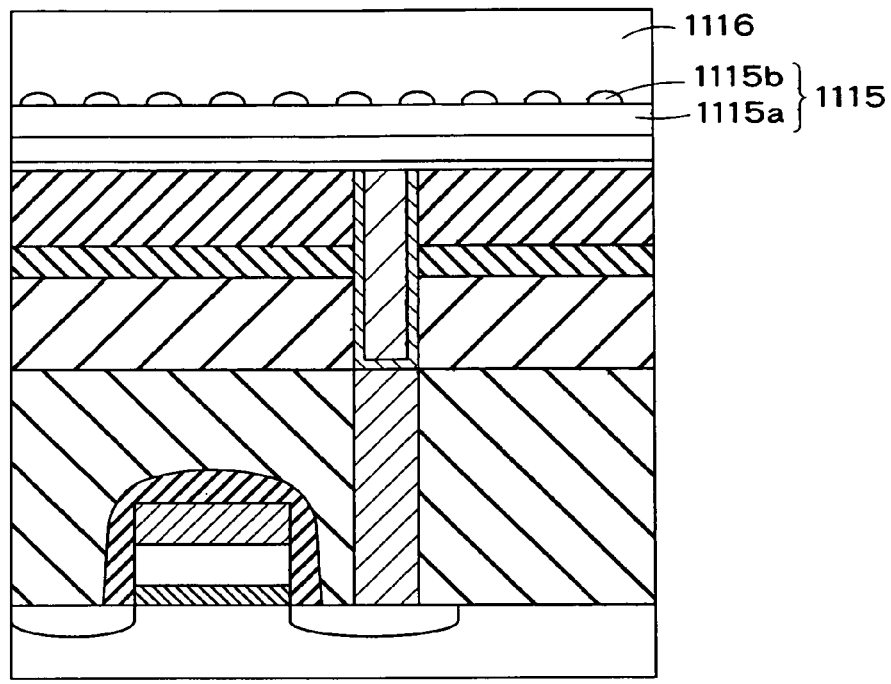
F I G. 17
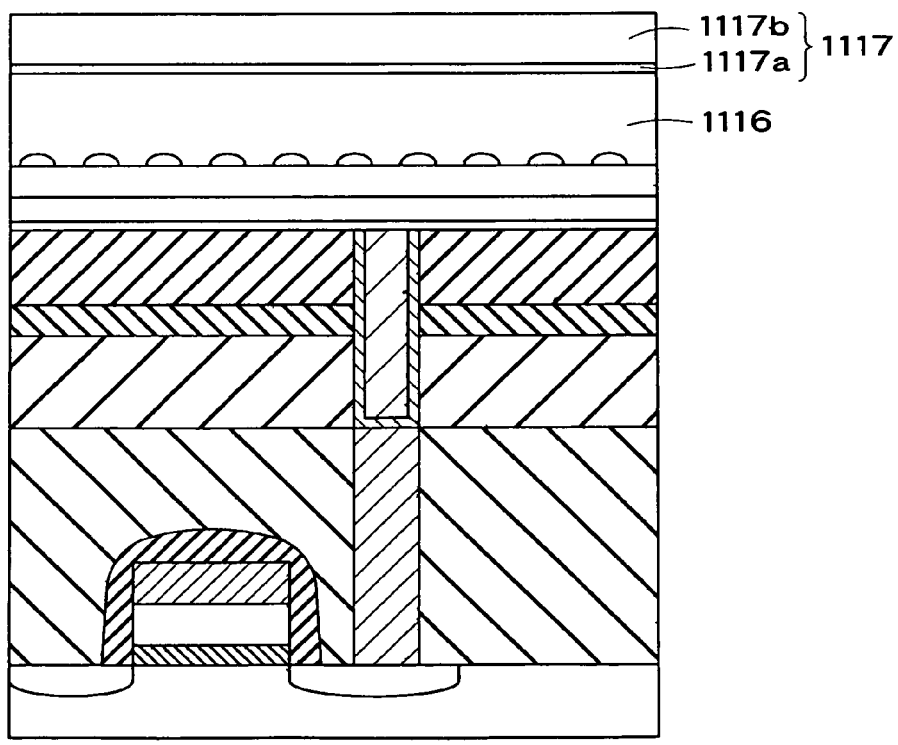
F I G. 18

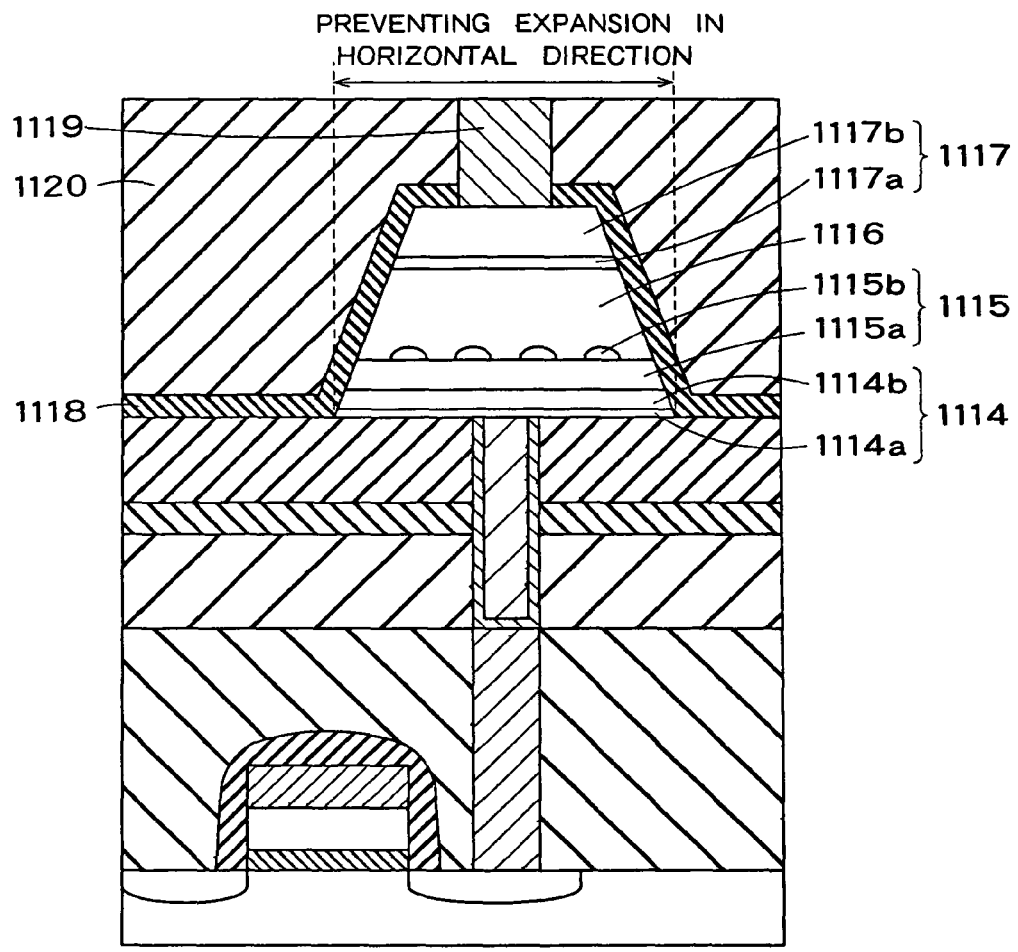
F I G. 19
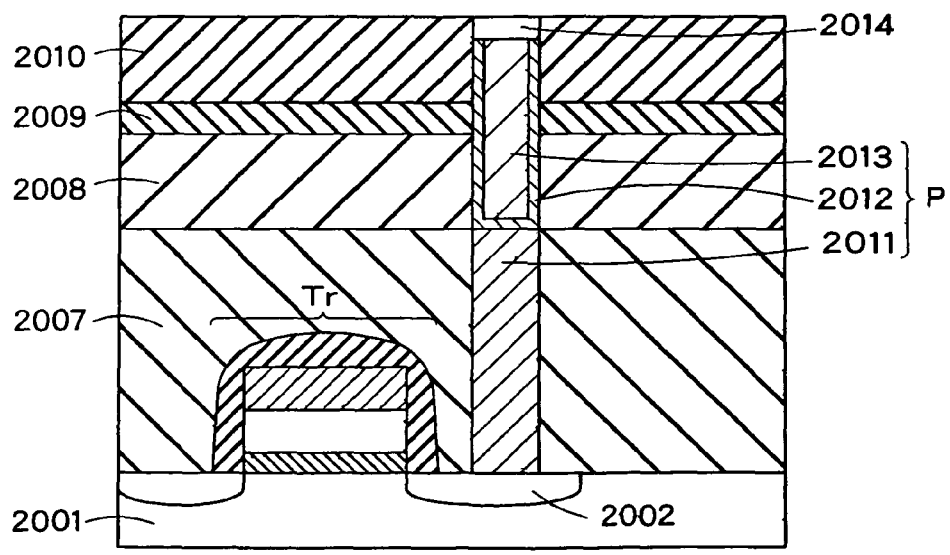
F I G. 20

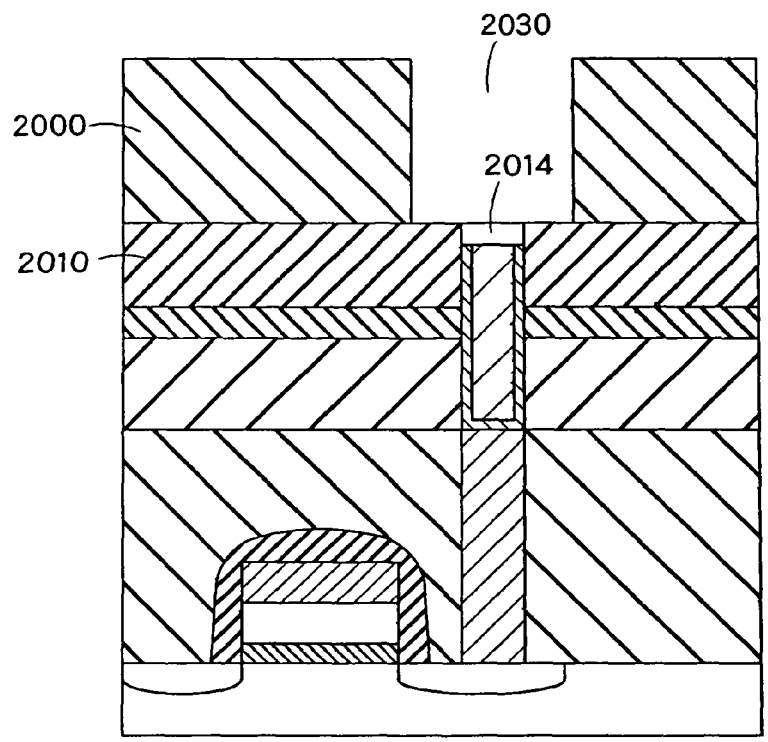
F I G. 21
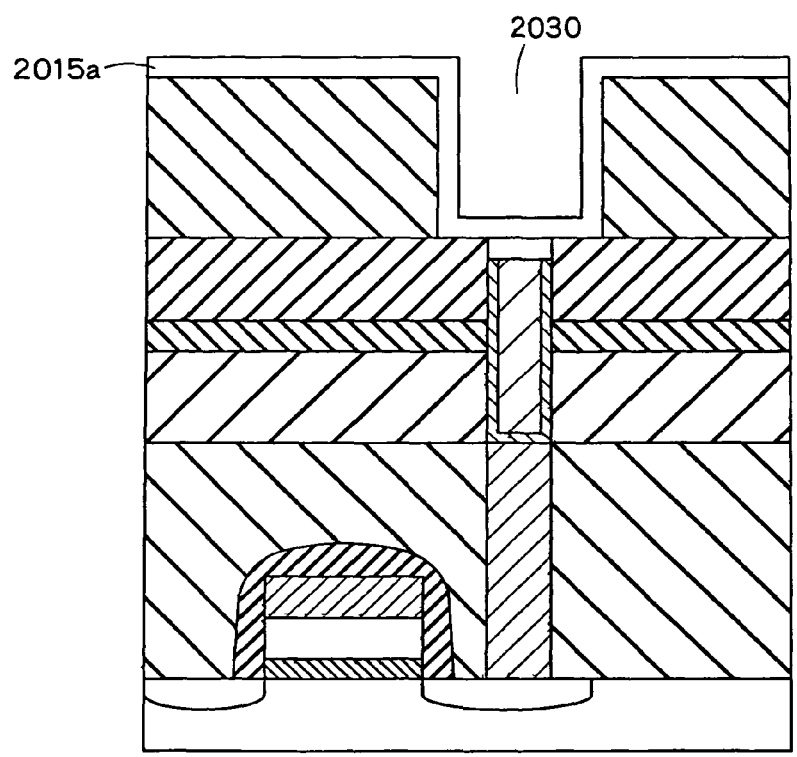
F I G. 22

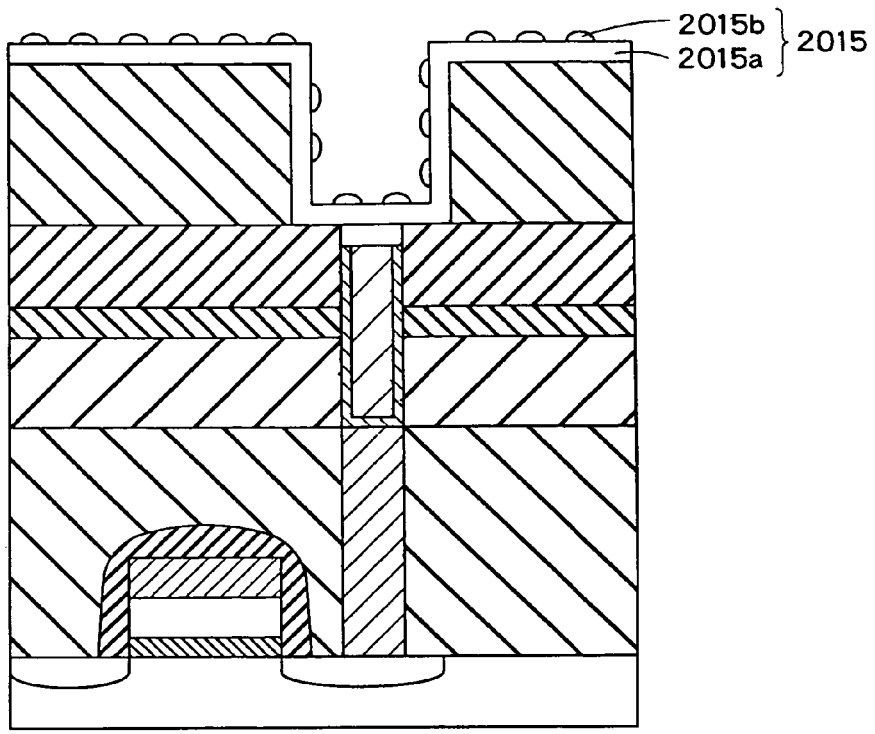
F I G. 23
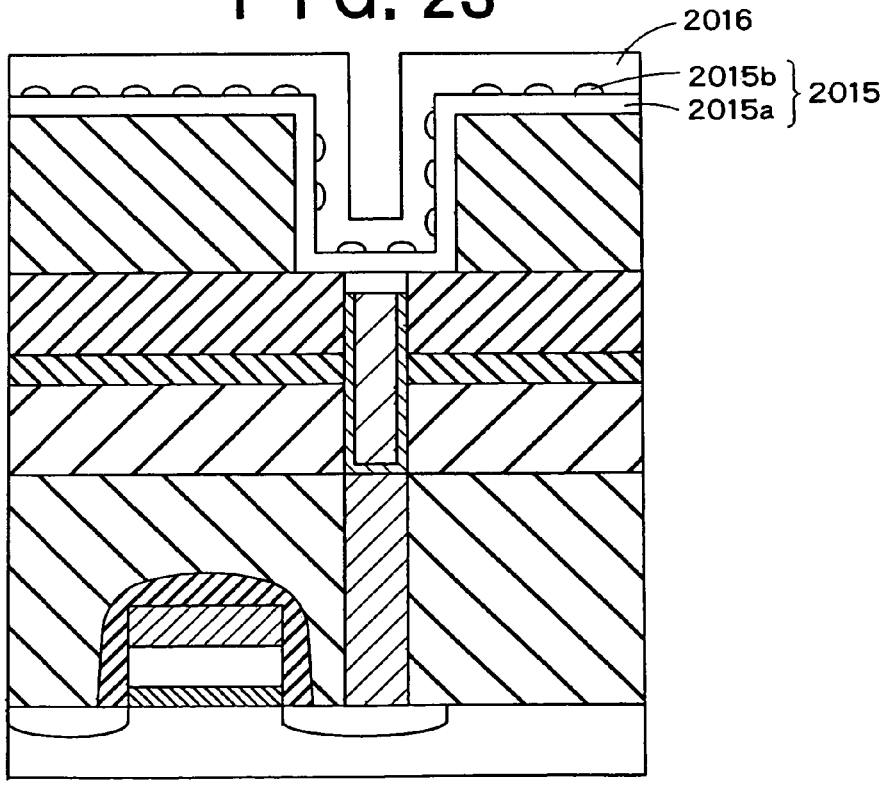
F I G. 24

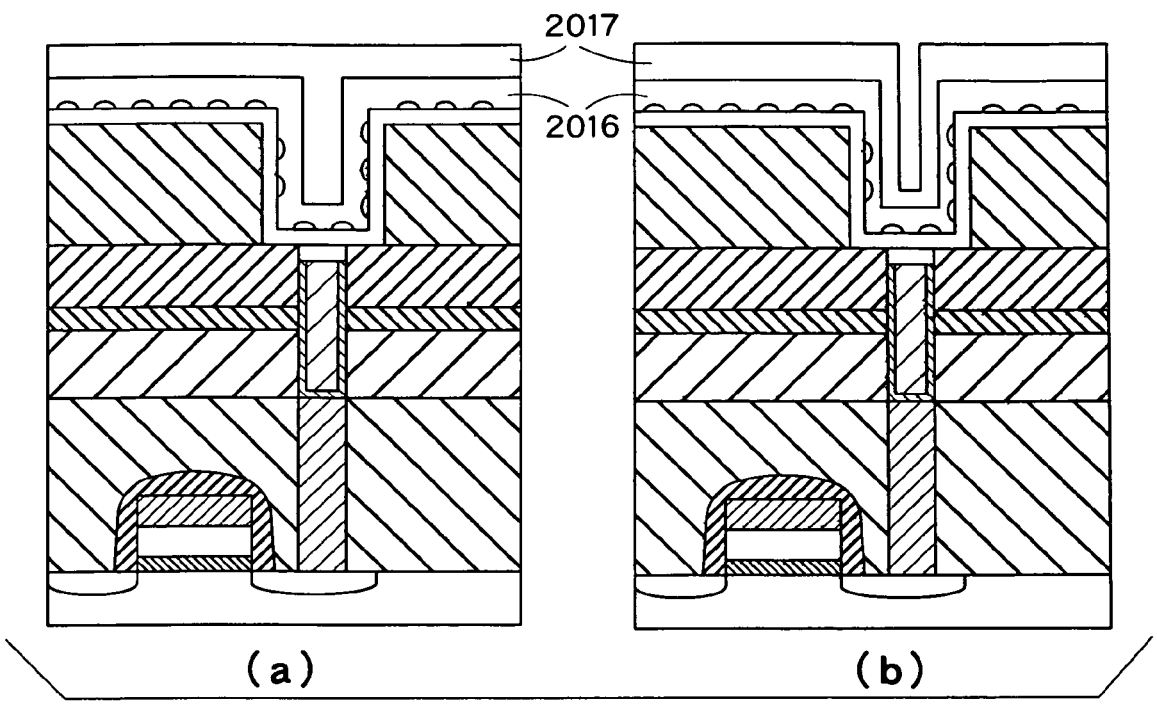
F I G. 25
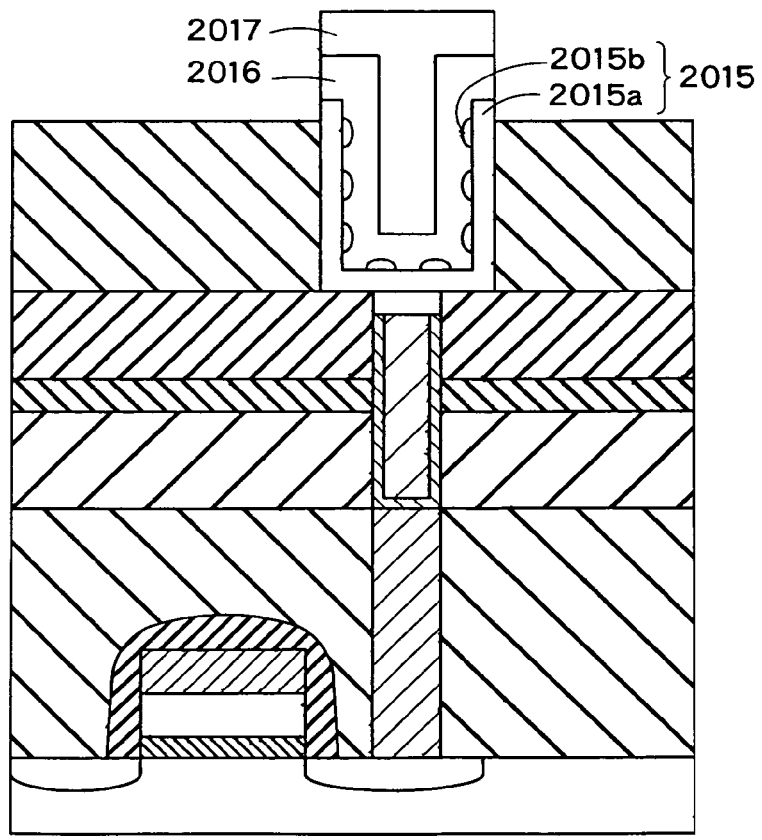
F I G. 26

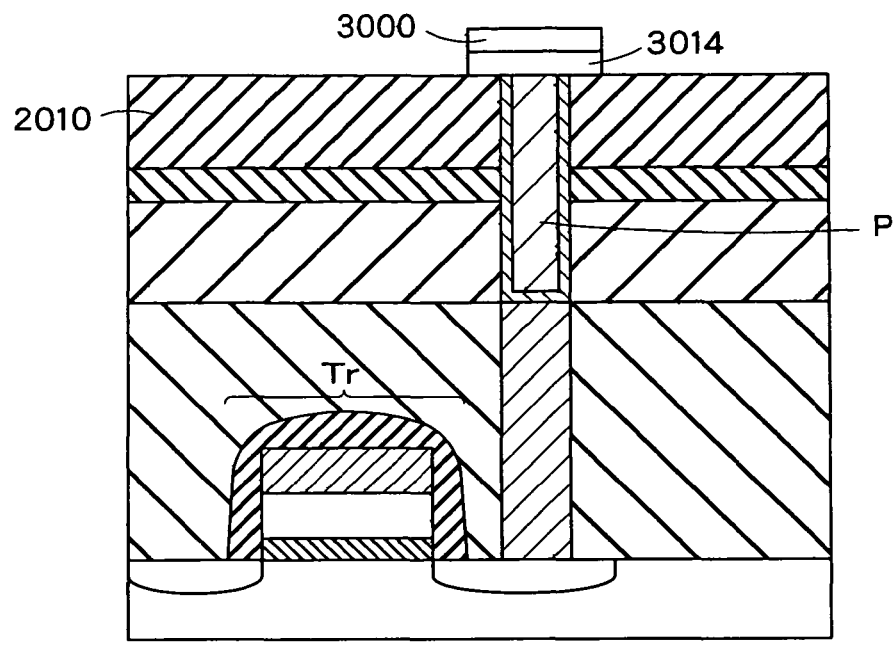
F I G. 27
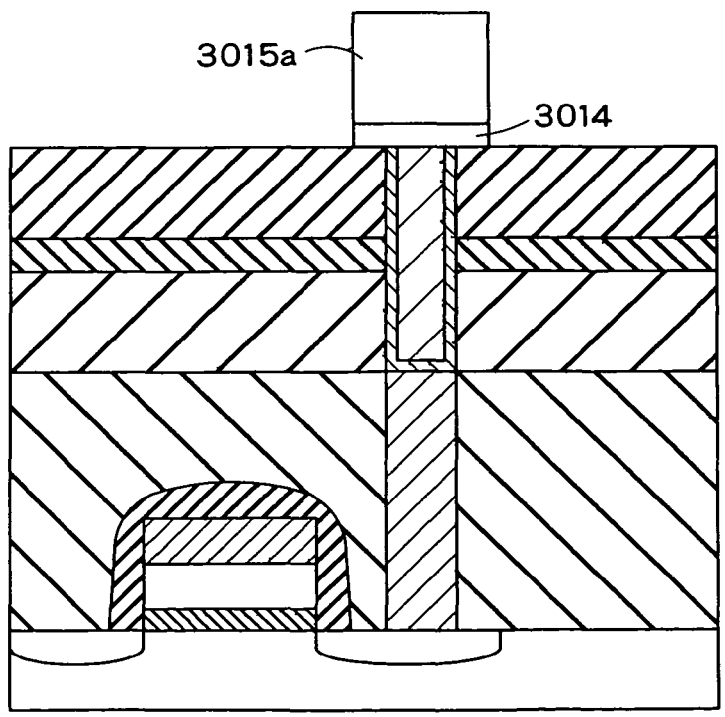
F I G. 28

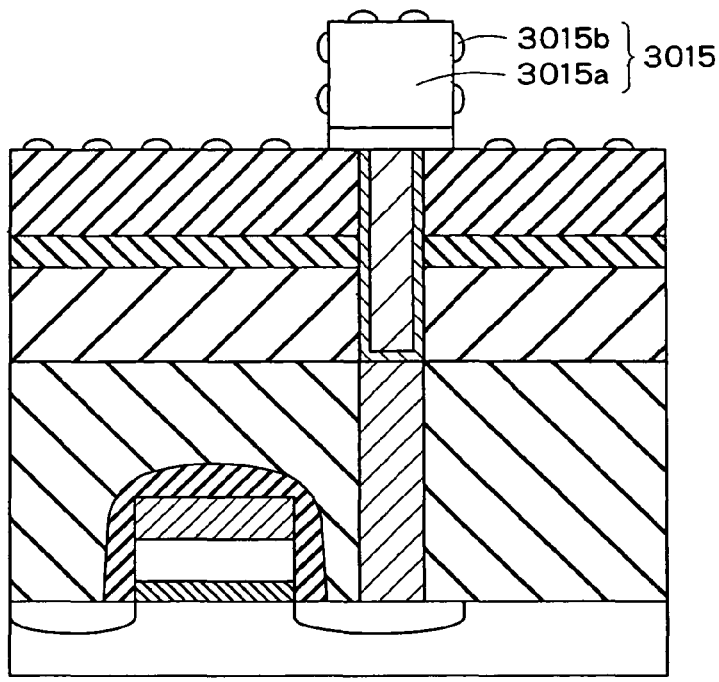
F I G. 29
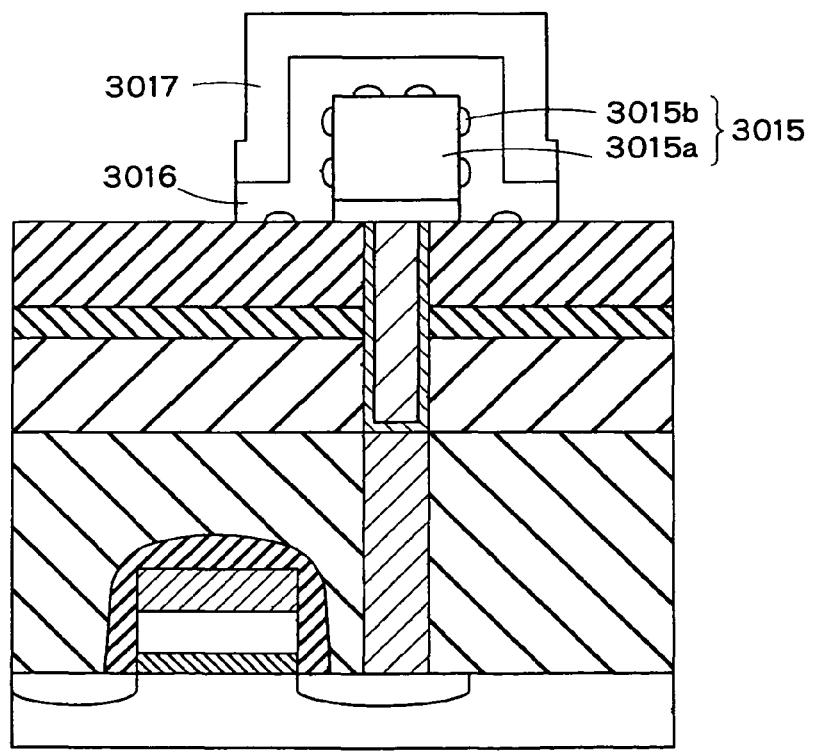
F I G. 30

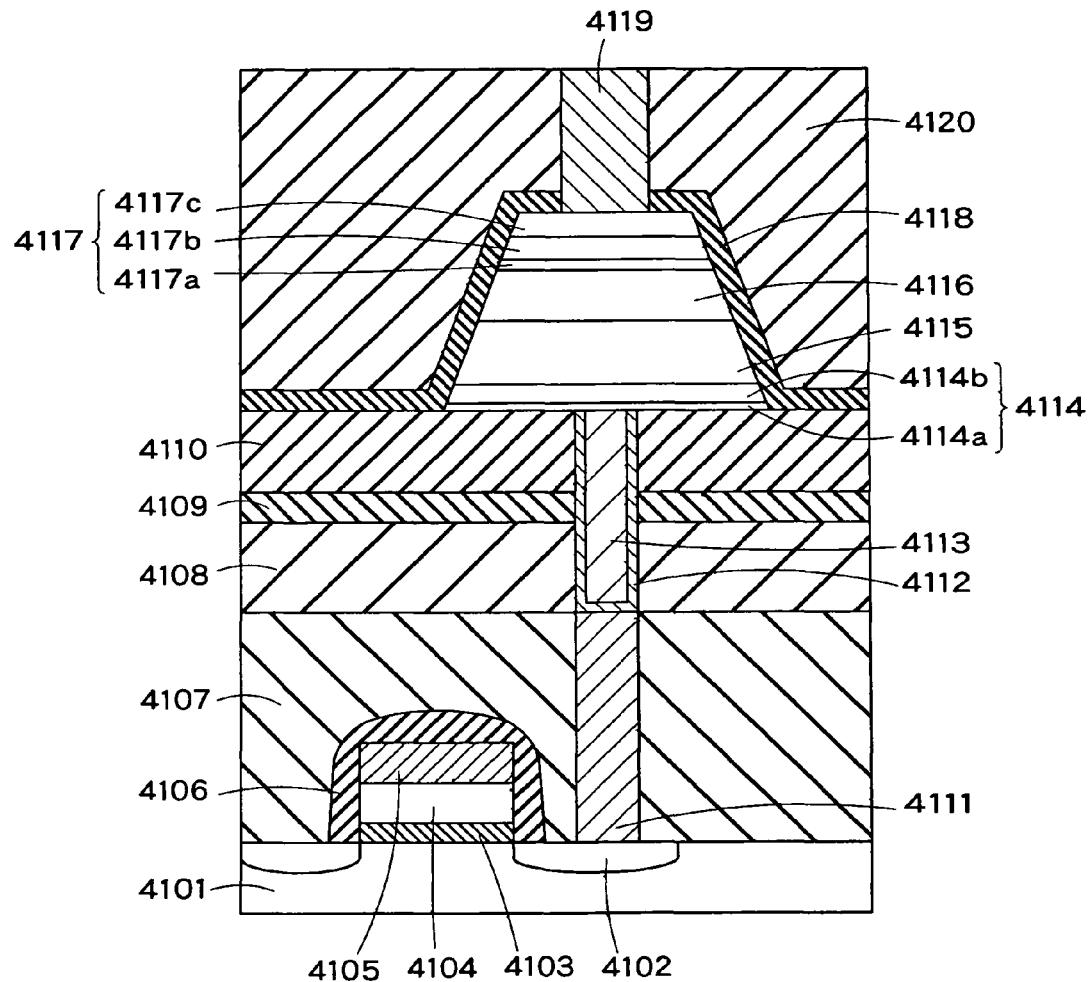
F I G. 31

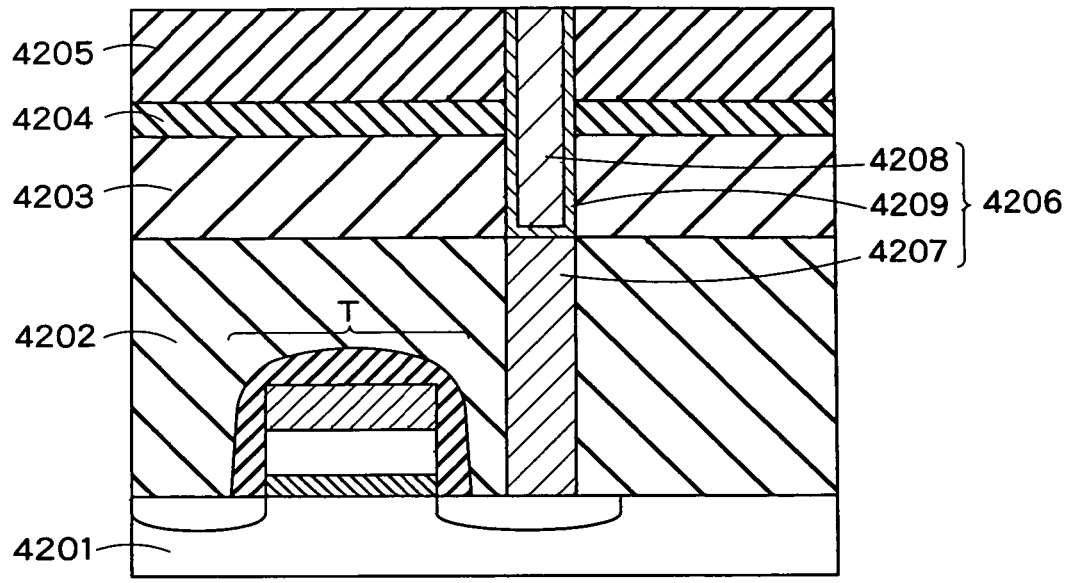
F I G. 32
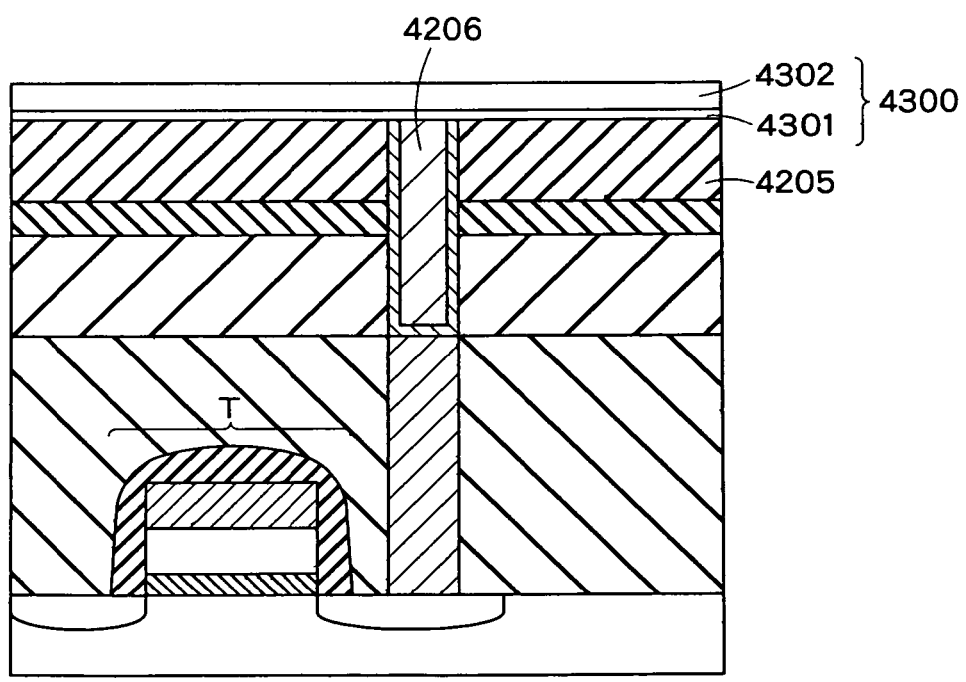
F I G. 33

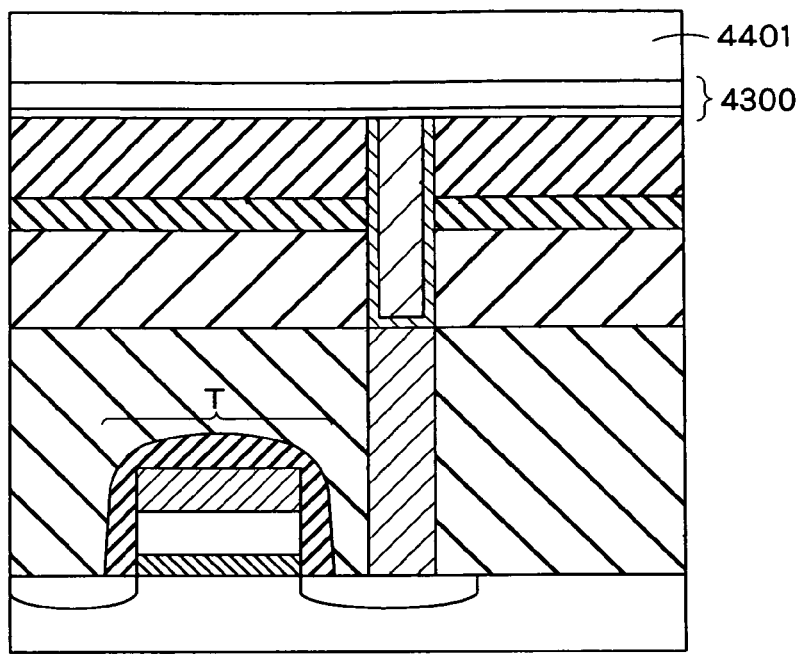
F I G. 34
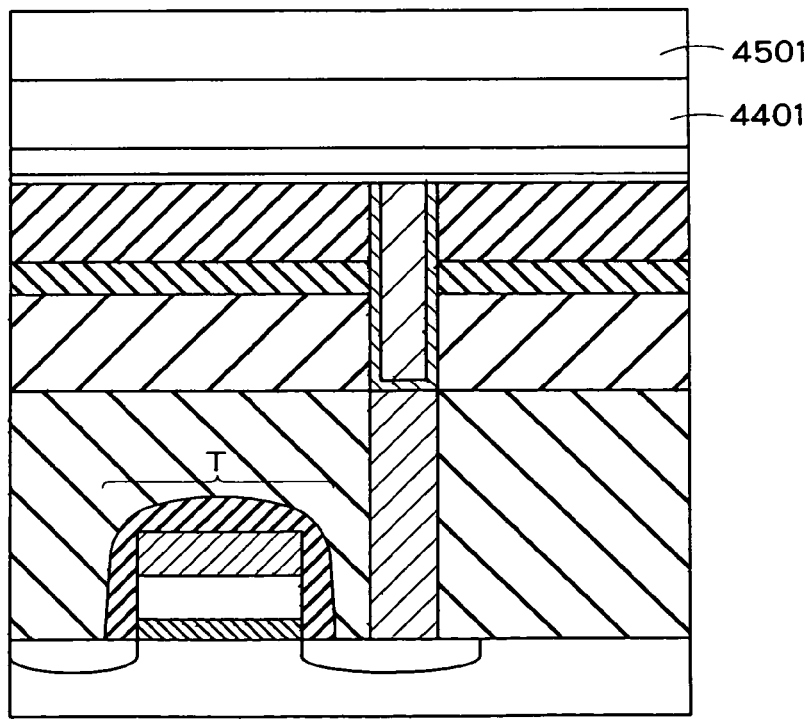
F I G. 35

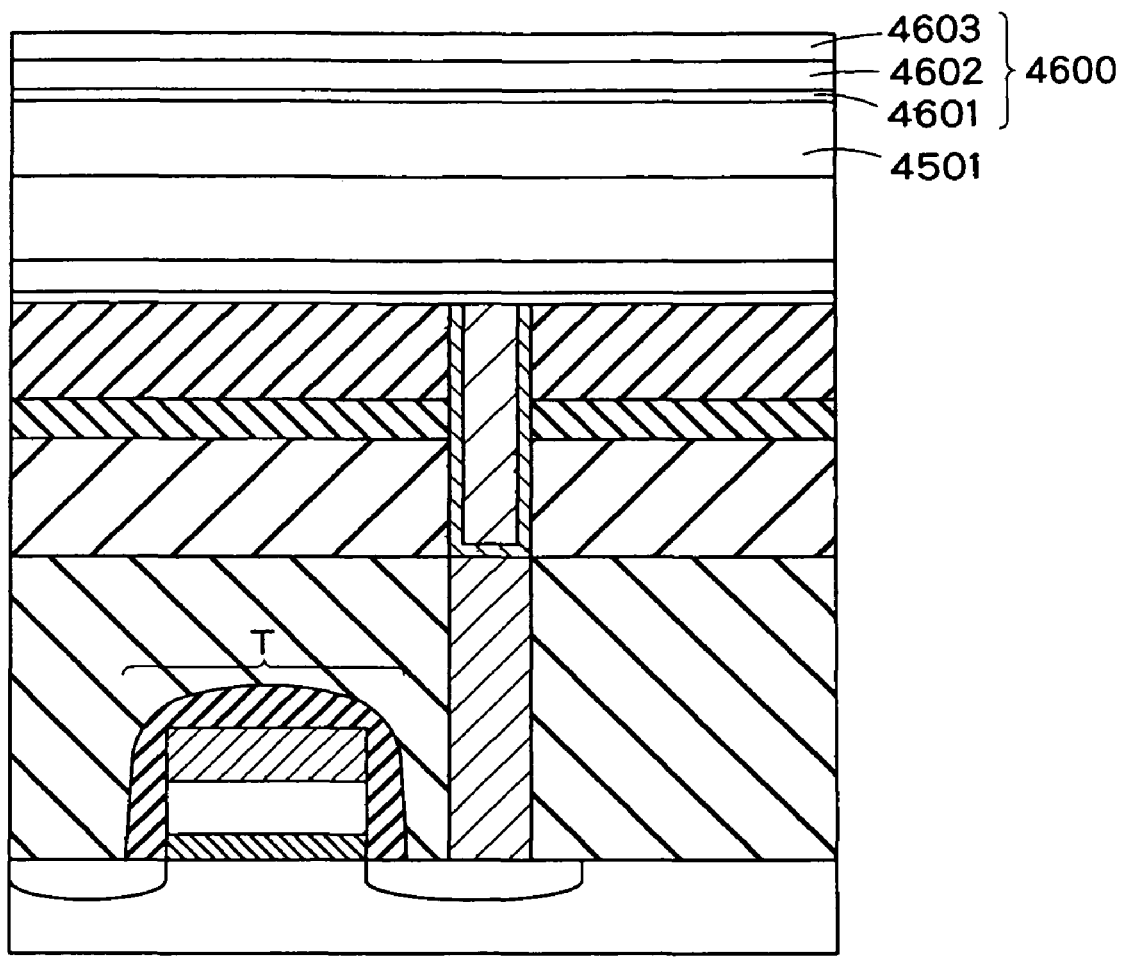
F I G. 36

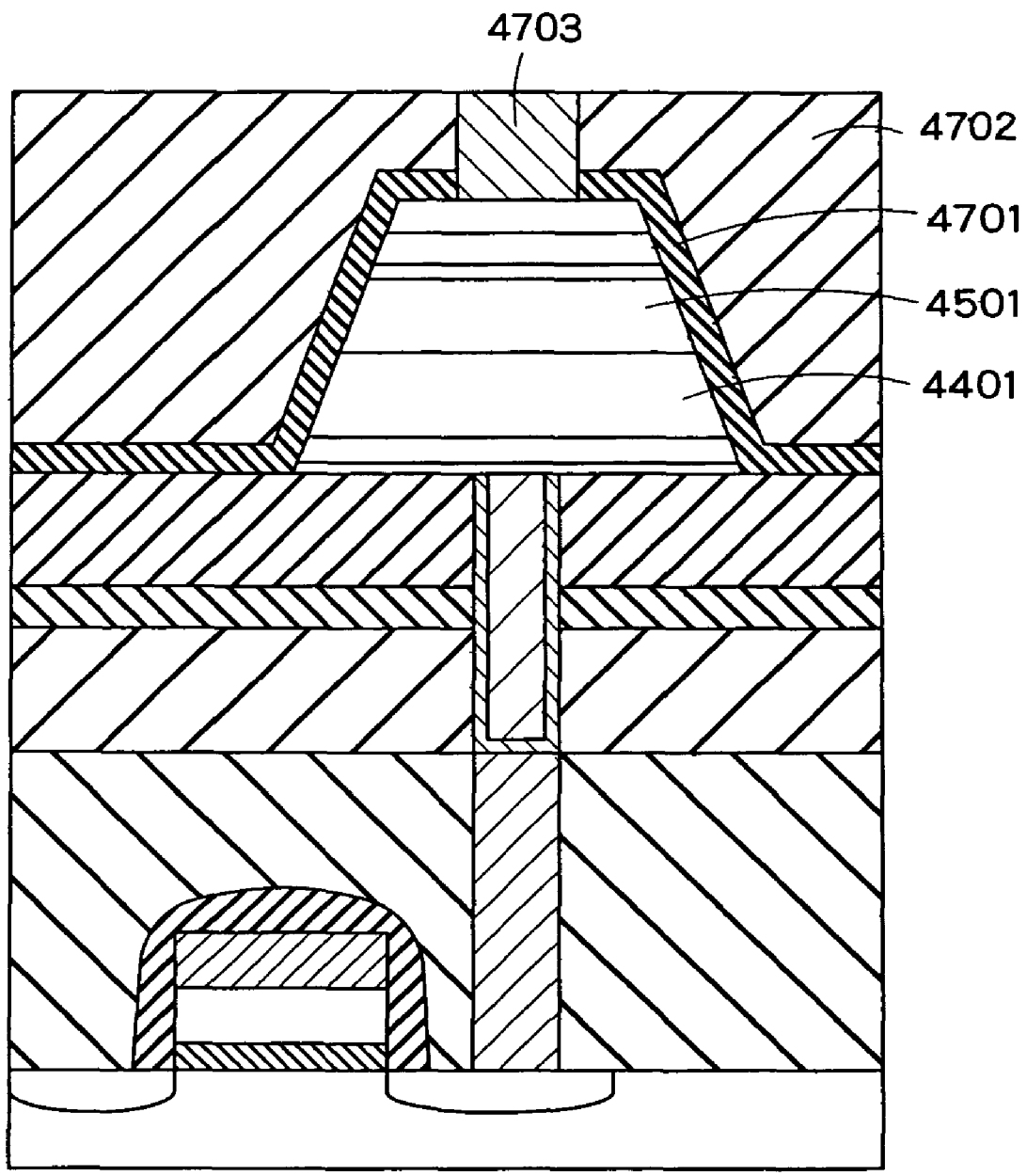
F I G. 37

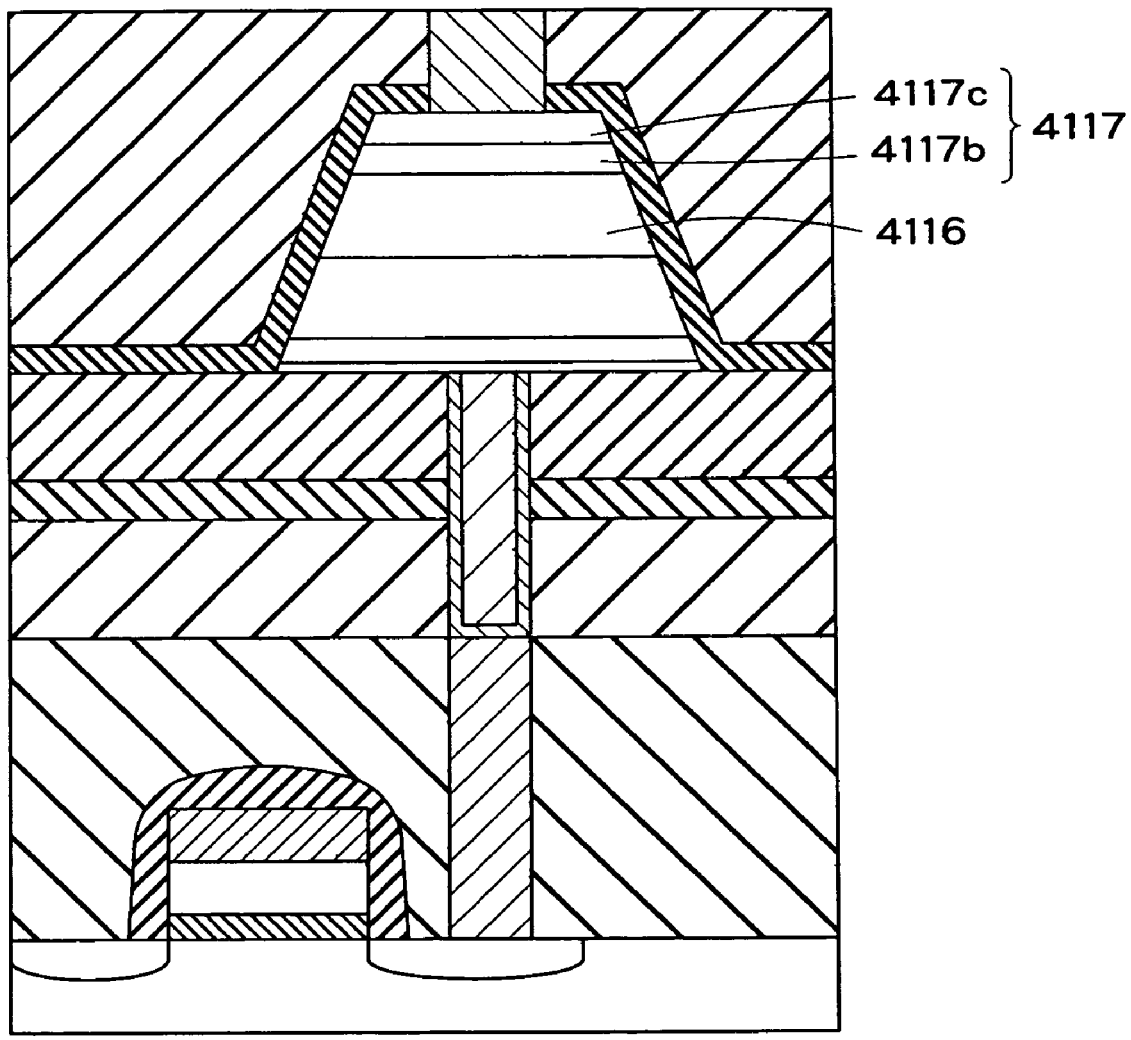
F I G. 38

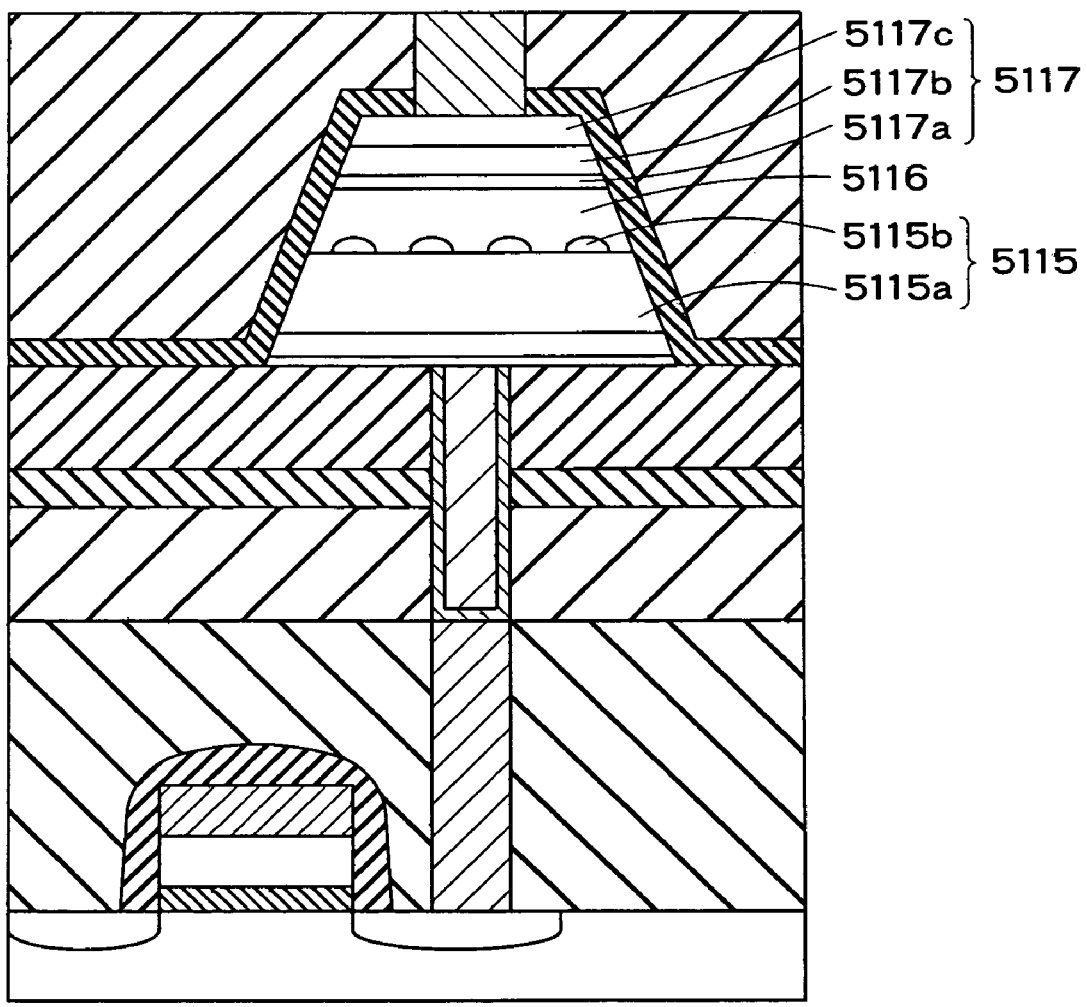
F I G. 39

METHOD OF MANUFACTURING SEMICONDUCTOR DEVICE WITH LOWER CAPACITOR ELECTRODE THAT INCLUDES ISLANDS OF CONDUCTIVE OXIDE FILMS ARRANGED ON A NOBLE METAL FILM

CROSS REFERENCE TO RELATED APPLICATION

This is a division of application Ser. No. 12/241,122, filed Sep. 30, 2008, now U.S. Pat. No. 7,812,425, which is incorporated herein by reference.

This application is based upon and claims benefit of priority from the Japanese Patent Application No. 2007-261805, filed on Oct. 5, 2007, and the Japanese Patent Application No. 2007-261987, filed on Oct. 5, 2007, the entire contents of which are incorporated herein by reference.

BACKGROUND OF THE INVENTION

The present invention relates to a semiconductor device and a method of manufacturing thereof.

A ferroelectric random access memory (FeRAM) is a kind of nonvolatile memory which uses in its capacitor part a ferroelectric film such as PZT ($Pb(Zr_xTi_{1-x})O_3$), BIT ($Bi_4Ti_3O_{12}$), SBT ($SrBi_2Ta_2O_9$), or the like, of which residual polarization is used in holding data.

As a method of forming a PZT film to serve as a ferroelectric film on a lower electrode, there is a sputtering method. In this method, an amorphous PZT film is formed on the lower electrode by sputtering, after which a thermal process using RTA (rapid thermal annealing) is carried out in an oxygen stream environment at a temperature of 650° C. to crystallize the amorphous PZT film.

With respect to such PZT film, however, defects such as oxygen vacancies can be generated easily at the interface portion with the lower electrode. Such defects will generate space charge which could deteriorate the fatigue characteristic (i.e. a deterioration behavior in the amount of polarization due to polarization inversion), the imprint characteristic (i.e. a phenomenon in which, when polarization is turned to one direction and retained, the polarization becomes more tended to turn in that direction), and so forth.

As a method to cope with such characteristic deterioration, a ferroelectric capacitor having a ferroelectric film (PZT film) being formed by a MOCVD (Metal Organic Chemical Vapor Deposition) method on a lower electrode that has a laminated structure composed of Pt and a conductive oxide film such as SRO ($SrRuO_3$) has been proposed. By using such conductive oxide film, switching voltage can be reduced, enabling to bring out better switching characteristic, and in addition to that, the fatigue characteristic can be improved.

However, the PZT film formed on the conductive oxide film using the MOCVD method will have lower crystallizing ability, which allows defects such as vacancies to be formed inside the film more easily. This leads to a problem of decreasing reliability of a semiconductor device.

Meanwhile, along with the FeRAM becoming more highly integrated, there is a need for miniaturization of capacitor size. As one method of miniaturizing the capacitor size, thinning of a capacitor film, especially of a lower electrode film, can be considered.

The lower electrode film is usually formed by a noble metal film such as Pt, Ir, or the like, for instance, and it has influence on the structural characteristic and the electrical characteristic of the ferroelectric film formed thereon. By reducing the film thickness of the lower electrode film, it is possible to prevent the capacitor size from expanding in the horizontal direction at the time of processing the capacitor using RIE (reactive ion etching) with a taper angle.

However, thinning the lower electrode film (noble metal film) will result in deterioration in the crystallizing ability, orientation intensity, etc. of the lower electrode film. Therefore, with this method, the crystallizing ability, the orientation and the electrical characteristic of the ferroelectric film formed on the lower electrode film will deteriorate, which leads to a problem of decreasing reliability of a semiconductor device.

As another method of miniaturizing the capacitor size, a three-dimensional structured capacitor, which is a capacitor being three-dimensionalized, can be considered. As to the types of the three-dimensional structured capacitors, there are a concave type, a convex type, and so forth. In the concave type capacitor, a capacitor area is dug in a shape of a trench inside which a ferroelectric film is formed. In the convex type capacitor, a ferroelectric film is formed on a lower electrode having a convex shape.

In a case when a method of producing the lower electrode with a laminated structure of a noble metal film such as Pt and a conductive oxide film such as SRO, as the one described above, is applied to the three-dimensional structured capacitor (especially the concave type), it should be difficult to form the conductive oxide film with uniform composition and even thickness on the noble metal film. Such possible changes in composition and film thickness lead to a problem of deteriorating the capacitor characteristic.

In this way, in the case of thinning the lower electrode film or three-dimensionalizing the capacitor for the purpose of miniaturizing the capacitor size, there is a problem that reliability of a semiconductor device will be deteriorated.

SUMMARY OF THE INVENTION

According to one aspect of the present invention, there is provided a semiconductor device, comprising:
a semiconductor substrate; and
a capacitor which is provided on the upper side of the semiconductor substrate and composed of a lower electrode, an upper electrode and a dielectric film, the dielectric film being placed in between the lower electrode and the upper electrode,
the lower electrode including
a noble metal film, and
a plurality of conductive oxide films formed in an islands arrangement on the noble metal film.

According to one aspect of the present invention, there is provided a semiconductor device, comprising:
a semiconductor substrate; and
a capacitor which is provided on the upper side of the semiconductor substrate and composed of a lower electrode, an upper electrode and a dielectric film, the dielectric film being placed in between the lower electrode and the upper electrode,
the upper electrode including
a first $MO_x$ type conductive oxide film ("M" is a metal element, "O" is an oxygen element, and x>0) having a crystal structure, and
a second $MO_x$ type conductive oxide film ("M" is a metal element, "O" is an oxygen element, and x>0) which is formed on the first $MO_x$ type conductive oxide film, has a crystal structure, and has a smaller oxygen ratio than the first $MO_x$ type conductive oxide film.

According to one aspect of the present invention, there is provided a method of manufacturing a semiconductor device, comprising:

forming a noble metal film, which is to become a part of a lower electrode, on the upper side of a semiconductor substrate, the lower electrode being a component of a capacitor;

forming a conductive oxide film to a film thickness of 10 nm or less on the noble metal film;

processing the conductive oxide film into a plurality of films in an islands arrangement;

forming a dielectric film, which is a component of the capacitor, on the noble metal film and the plurality of conductive oxide films formed in an islands arrangement, using a MOCVD (Metal Organic Chemical Vapor Deposition) method; and forming an upper electrode, which is a component of the capacitor, on the dielectric film.

According to one aspect of the present invention, there is provided a method of manufacturing a semiconductor device, comprising:

forming a lower electrode film, which is a component of a capacitor, on the upper side of a semiconductor substrate;

forming a dielectric film, which is a component of the capacitor, on the lower electrode film;

forming a first $MO_x$ type conductive oxide film ("M" is a metal element, "O" is an oxygen element, and x>0) on the dielectric film by conducting a reactive sputtering method using metal M as a target; and forming a second $MO_x$ type conductive oxide film ("M" is a metal element, "O" is an oxygen element, and x>0) on the first $MO_x$ type conductive oxide film by conducting a reactive sputtering method using a target including the metal M under the condition that a flow rate of $O_2$ with respect to a flow rate of Ar is smaller or a sputtering power is larger than in the formation of the first $MO_x$ type conductive oxide film.

BRIEF DESCRIPTION OF THE DRAWINGS

FIG. 1 is a schematic structure diagram of a semiconductor device according to a first embodiment of the present invention;

FIG. 2 is a graphic representation showing a relationship between coverage and the amount of polarization;

FIG. 3 is a graphic representation showing a relationship between coverage and the amount of imprint;

FIG. 4 is a sectional view explaining a manufacturing process in a method of manufacturing a semiconductor device according to the first embodiment of the present invention;

FIG. 5 is a sectional view showing a step subsequent to FIG. 4;

FIG. 6 is a sectional view showing a step subsequent to FIG. 5;

FIG. 7 is a sectional view showing a step subsequent to FIG. 6;

FIG. 10 is a sectional view showing a step subsequent to FIG. 9;

FIG. 12 is a graphic representation showing a relationship between a film thickness of an Ir film and a signal voltage;

FIG. 15 is a sectional view showing a step subsequent to FIG. 14;

FIG. 16 is a sectional view showing a step subsequent to FIG. 15;

FIG. 17 is a sectional view showing a step subsequent to FIG. 16;

FIG. 18 is a sectional view showing a step subsequent to FIG. 17;

FIG. 19 is a sectional view showing a step subsequent to FIG. 18;

FIG. 20 is a sectional view explaining a manufacturing process in a method of manufacturing a semiconductor device according to a third embodiment of the present invention;

FIG. 21 is a sectional view showing a step subsequent to FIG. 20;

FIG. 22 is a sectional view showing a step subsequent to FIG. 21;

FIG. 23 is a sectional view showing a step subsequent to FIG. 22;

FIG. 24 is a sectional view showing a step subsequent to FIG. 23;

FIG. 25 is a sectional view showing a step subsequent to FIG. 24;

FIG. 26 is a sectional view showing a step subsequent to FIG. 25;

FIG. 27 is a sectional view explaining a manufacturing process in a method of manufacturing a semiconductor device according to a variant of the present invention;

FIG. 28 is a sectional view showing a step subsequent to FIG. 27;

FIG. 29 is a sectional view showing a step subsequent to FIG. 28;

FIG. 30 is a sectional view showing a step subsequent to FIG. 29;

FIG. 31 is a schematic structure diagram of a semiconductor device according to a fourth embodiment of the present invention;

FIG. 32 is a sectional view explaining a manufacturing process in a method of manufacturing a semiconductor device according to the fourth embodiment of the present invention;

FIG. 33 is a sectional view showing a step subsequent to FIG. 32;

FIG. 34 is a sectional view showing a step subsequent to FIG. 33;

FIG. 35 is a sectional view showing a step subsequent to FIG. 34;

FIG. 36 is a sectional view showing a step subsequent to FIG. 35;

FIG. 37 is a sectional view showing a step subsequent to FIG. 36;

FIG. 38 is a schematic structure diagram of a semiconductor device according to a variant of the present invention;

FIG. 39 is a schematic structure diagram of a semiconductor device according to a variant of the present invention.

DESCRIPTION OF THE EMBODIMENTS

Figure 8:
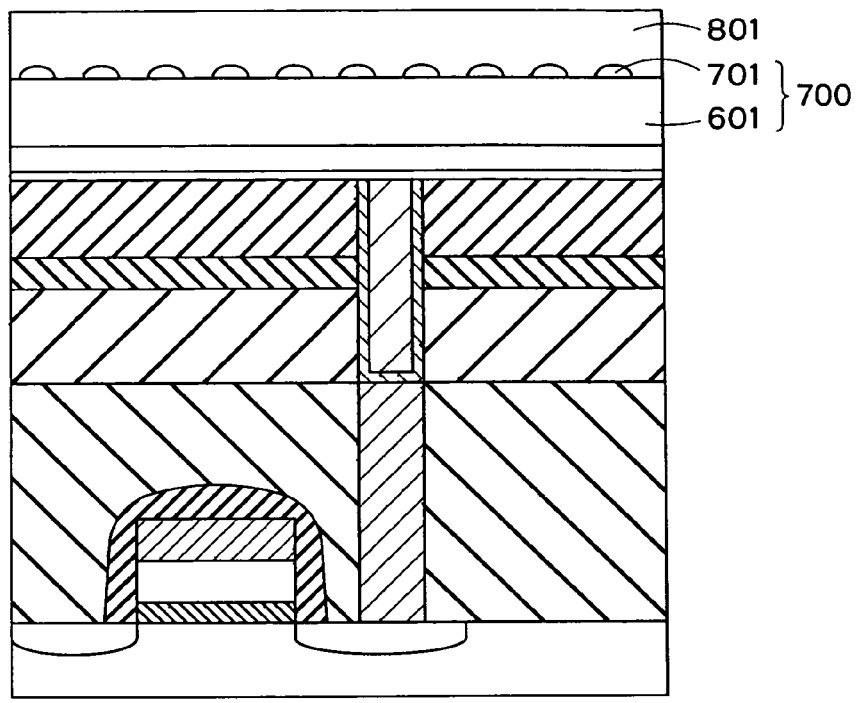
FIG. 8 is a sectional view showing a step subsequent to FIG. 7.

Referring now to the drawings, a semiconductor device and a method of manufacturing thereof according to embodiments of the present invention will be described.

First Embodiment

FIG. 1 shows a schematic structure of a semiconductor device according to a first embodiment of the present invention. On a semiconductor substrate 101, an isolation (not shown) in a shape of a trench is formed, and a MOS transistor is formed as being composed of a gate insulating film 103, a gate electrode (a polycide structure composed of a polysilicon film 104 and a tungsten silicide film 105, for example) to serve as a word line, gate cap and gate sidewall films 106 made of silicon nitride films, and a source/drain diffusion layer 102.

An interlayer insulating film 107 (silicon oxide film) formed as surrounding the MOS transistor is planarized, upon which more interlayer insulating films 108 (silicon oxide film), 109 (silicon nitride film) and 110 (silicon oxide film) are formed.

Within these interlayer insulating films 107, 108, 109 and 110, a contact plug 111 and a tungsten plug 113, which connect the source/drain diffusion layer 102 and a barrier layer 114 of a capacitor, are formed. Furthermore, a diffusion preventing film (contact barrier film) 112 is formed in way surrounding the tungsten plug 113.

The capacitor is formed on the interlayer insulating film 110. The capacitor is composed of a barrier layer (capacitor barrier film) 114, a lower electrode 115, a capacitor dielectric film 116 and an upper electrode 117, which are sequentially laminated.

Furthermore, a hydrogen preventing film 118 made of an $AlO_x$ film, for instance, is formed in a way entirely surrounding the capacitor. In an interlayer insulating film (silicon oxide film) 120 formed on the hydrogen preventing film 118, a contact 119 for connecting with the upper electrode in the adjacent capacitor is formed.

The barrier layer 114 has a laminated structure composed of a TiAl film 114a and a TiAlN film 114b, for instance.

The lower electrode 115 includes an Ir film (noble metal film) 115a and a plurality of SRO films (conductive oxide films) 115b formed on the Ir film 115a in an islands arrangement.

The capacitor dielectric film 116 is a PZT film formed by a MOCVD (Metal Organic Chemical Vapor Deposition) method. The upper electrode 117 has a laminated structure composed of a SRO film 117a and an $IrO_2$ film 117b.

The PZT film 116 is partially formed on the SRO films 115b and the remaining portions of it are formed on the Ir film 115a. Therefore, there are two laminated structures, one being a laminated structure of a PZT film and an Ir film and the other being a laminated structure of a PZT film and a SRO film.

In the case of forming the PZT film on the Ir film using the MOCVD method, it is possible to reduce possible defects which can be generated in the interface portion between the films. Moreover, the PZT film will have improved crystallizing ability, and thus, possible defects which can be generated inside the PZT film can be reduced as well. Therefore, the imprint characteristic and the retention characteristic (i.e. a deterioration behavior of retained amount of polarization) can be improved.

The contact structure of the SRO film and the PZT film will become a core of polarization inversion, which allows the switching voltage to be reduced, and the switching characteristic and the fatigue characteristic to be improved.

FIG. 2 shows a relationship between coverage of SRO films 115b with respect to the upper surface of the Ir film 115a and the amount of polarization. As can be seen in FIG. 2, the amount of polarization increases as the coverage decreases. It is preferable that the amount of polarization is 40 $\mu C/cm^2$ or greater. Accordingly, it is suitable that the coverage of the SRO films 115b is 80% or less.

FIG. 3 shows a relationship between coverage of SRO films 115b with respect to the upper surface of the Ir film 115a and the amount of imprint. As can be seen in FIG. 3, the amount of imprint decreases as the coverage increases.

"Imprint" as referred to herein is defined as asymmetry in the hysteresis characteristic of the ferroelectric capacitor film. When the amount of imprint is large in the initial state, a difference in the amount of electric charges stored in the capacitor will become larger depending on the direction of polarization, or the amount of switching charges (amount of stored charges) associated with polarization inversion will decrease, which is not desirable in terms of memory operation.

Generally, "imprint" implies a stabilizing effect such that polarization amount maintains its direction, and also implies that, when writing is performed in the direction of inverted polarization after a written state has been retained in the memory operation, the polarization retention characteristic will become unstable.

This effect is notable in a case when the PZT film is formed directly on the Ir lower electrode, but can be prevented by adopting the SRO film.

It is desirable that the ferroelectric film has larger amount of polarization and smaller amount of imprint. Accordingly, it is suitable that the coverage of the SRO films 115b with respect to the upper surface of the Ir film 115a is 20% or over but not exceeding 80%. More preferably, it is suitable that the coverage is 40% or over but not exceeding 60%.

In this way, with respect to the semiconductor device according to the present embodiment of the invention, the interface portion between the lower electrode and the ferroelectric film will include two kinds of interfaces which are the interface of the noble metal film and the ferroelectric film, and the interface of the conductive oxide film and the ferroelectric film. Such arrangement will provide improved switching characteristic and higher reliability with respect to the semiconductor device.

Now a method of manufacturing the semiconductor device as described above will be described with reference to FIG. 4 to FIG. 10.

As shown in FIG. 4, a transistor T is to be formed on a silicon substrate 401, using a heretofore known process, to form a CMOS structure. Then, a silicon oxide film 402, a silicon oxide film 403, a silicon nitride film 404 and a silicon oxide film 405 are to be deposited using a CVD (chemical vapor deposition) method and a CMP (chemical mechanical polishing) method, to form an interlayer insulating film.

At this point, a plug 406 is to be formed in advance since the connection between the capacitor and the active area (source/drain) of the transistor is to be made using plugs made of tungsten, polysilicon, or the like.

The plug 406 is formed as including a contact plug 407, a tungsten plug 408 and a contact barrier film 409 which is formed in a way surrounding the tungsten plug 408. In forming the plug 406, a blanket CVD method and a CMP method are to be used in combination.

As shown in FIG. 5, a barrier metal layer 500 is to be formed on the silicon oxide film 405 and the plug 406. The barrier metal layer 500 has a laminated structure composed of a TiAl film 501 and a TiAlN film 502. Using a DC magnetron sputtering method, the TiAl film 501 is to be formed to a thickness of 5 nm and the TiAlN film 502 is to be formed to a thickness of 30 nm.

The barrier metal layer 500 functions to prevent the surface of the plug 406 from being oxidized due to an annealing process in an oxygen environment which is to be carried out for forming the ferroelectric film or for later securing the capacitor characteristic.

As shown in FIG. 6, an Ir film 601 is to be formed to a thickness of 100 nm on the barrier metal layer 500 by a sputtering method. In order to prevent hillock formation, the Ir film 601 is to be formed by sputtering at a temperature of 300° C. or higher.

As shown in FIG. 7, SRO films 701 are to be formed in an islands arrangement on the Ir film 601. In the formation of the SRO films 701, first, an amorphous film is to be formed by applying a sputtering power of 0.5 to 1 kW to a SRO ceramic target of 300 mm diameter, at a room temperature.

Next, by a RTP (rapid thermal process), the amorphous film is to have its temperature raised to 650° C. in an oxygen environment to be crystallized into a perovskite structure. At this time, the film will not be formed uniformly while its thickness is 10 nm or less, but become partially concentrated. By such process, the SRO films 701 are to be formed in an islands arrangement.

It is also possible to form the SRO films in an islands arrangement by making the film thickness of the amorphous film 10 nm or less and gradually crystallizing the film at a substrate temperature of 600° C. or higher at the time of SRO sputtering.

Or else, the SRO film can be formed by sputtering at a room temperature as described above, and kept in an amorphous state. In this case, the SRO will crystallize as the temperature rises at the time of forming the PZT film by MOCVD.

Normally, crystallization of the amorphous SRO film requires a thermal process at a temperature of 550° C. or higher in an environment including oxygen. In this case, however, the surface of the Ir film will also be subjected to oxidization at the same time. Therefore, by first forming the SRO film in an amorphous state, it is possible to have the surface of the Ir film not oxidized until when the PZT film is formed by MOCVD. In this case also, after the PZT film is formed, the SRO film on the Ir electrode will crystallize in an islands arrangement.

The coverage of the SRO films formed in an islands arrangement with respect to the upper surface of the Ir film 601 can be controlled by a film thickness of the SRO film, while the coverage becomes larger as the film thickness increases.

As shown in FIG. 8, using a MOCVD method, a PZT film 801 is to be formed to a thickness of 100 nm on a lower electrode 700 composed of the Ir film 601 and the SRO films 701 formed in an islands arrangement. The PZT film formed on the Ir film 601 by the MOCVD method has good crystallizing ability, and it is capable of preventing possible defects from being generated inside the film or at parts of the interface with the lower electrode.

For example, the PZT film can be formed by conducting liquid-supply MOCVD using THF as a solvent and Pb $(dpm)_2$/THF, Ti(iPr)$_2$(dpm)$_2$/THF, and Zr(iPr)$_2$(dpm)$_2$/THF as source materials. In this case, a film formation temperature should be 600° C. or higher and oxygen should be used as a reaction gas.

After the PZT film is formed, it is also possible to carry out a thermal process at a temperature of 400° C. to 600° C. in order to remove impurities such as carbon from the PZT film.

Figure 9:
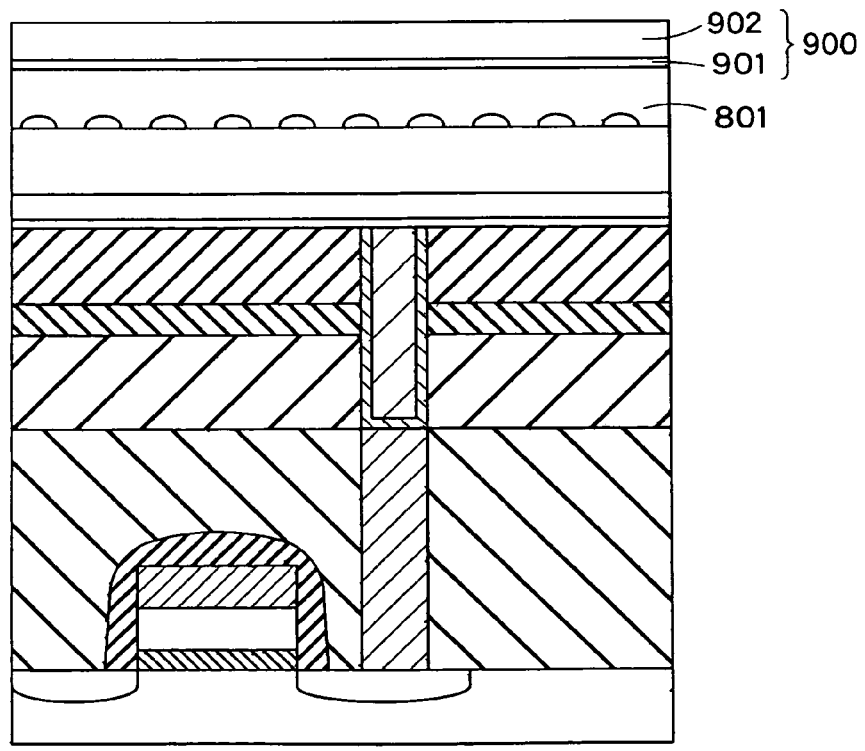
FIG. 9 is a sectional view showing a step subsequent to FIG. 8.

As shown in FIG. 9, an upper electrode 900 is to be formed on the PZT film 801. The upper electrode film 900 has a laminated structure composed of a SRO film 901 and an IrO$_2$ film 902. In forming the upper electrode 900, first, the SRO film 901 is to be formed to a thickness of 10 nm by a DC magnetron sputtering method, after which a crystallizing thermal process is to be carried out.

Next, the IrO$_2$ film 902 with a thickness of 80 nm is to be formed on the SRO film 901 by a DC magnetron sputtering method.

After the IrO$_2$ film 902 is formed, it is also possible to carry out a RTO (rapid thermal oxidation) process at a temperature of 500° C. By such thermal process, the IrO$_2$ film 902 will be densified, by which the resistance characteristic against reducible damage can be improved.

As shown in FIG. 10, a capacitor structure is to be formed by conducting a RIE process with respect to the upper electrode 900, the PZT film 801, the lower electrode 700 and the barrier metal layer 500 using a hard mask (not shown). After the mask is removed, an AlO$_x$ film (e.g. an Al$_2$O$_3$ film) 1001 to be serving as a hydrogen preventing film is to be formed in way covering the capacitor structure.

After that, an interlayer insulating film (silicon oxide film) 1002 is to be formed, and a contact 1003 for connecting with the upper electrode in the adjacent capacitor is to be formed inside the interlayer insulating film 1002.

In this way, according to the present embodiment of the invention, it is possible to manufacture a semiconductor device having the lower electrode with a plurality of SRO films 701 (conductive oxide films) formed in an islands arrangement on the Ir film (noble metal film) 601. Thereby, two kinds of laminated structures, one being a laminated structure composed of the noble metal film and the ferroelectric film and the other being a laminated structure composed of the conductive oxide film and the ferroelectric film, are formed in the interface portion between the lower electrode and the ferroelectric film. The laminated structure composed of the noble metal film and the ferroelectric film is capable of improving the crystallizing ability of the ferroelectric film, and the laminated structure composed of the conductive oxide film and the ferroelectric film is capable of reducing the coercive voltage and improving the fatigue and imprint characteristics.

With the method of manufacturing a semiconductor device according to the present embodiment, generation of possible defects can be prevented, and a semiconductor device with high reliability can be manufactured.

Second Embodiment

Figure 11:
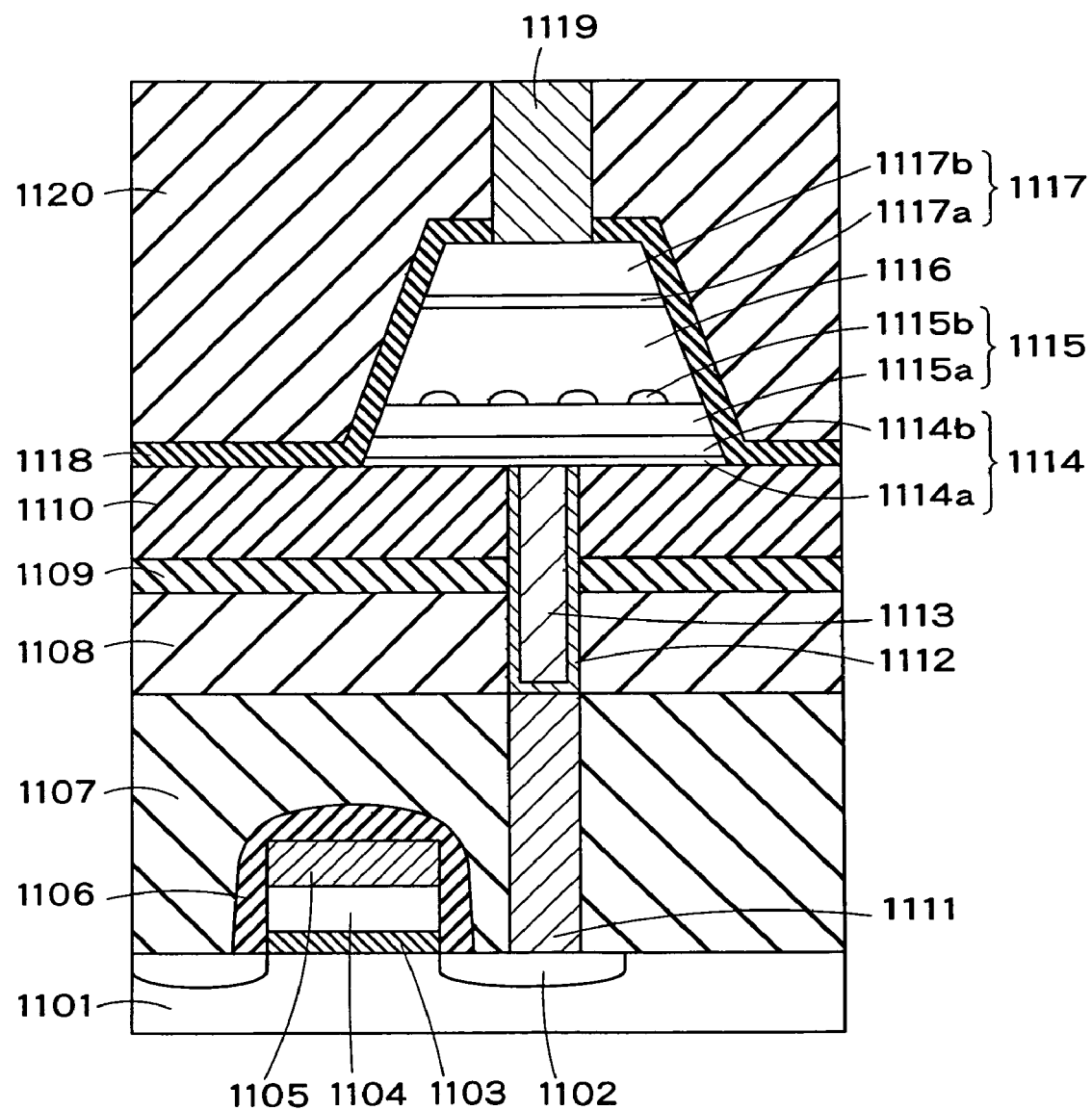
FIG. 11 is a schematic structure diagram of a semiconductor device according to a second embodiment of the present invention.

FIG. 11 shows a schematic structure of a semiconductor device according to a second embodiment of the present invention. On a semiconductor substrate 1101, a MOS transistor is formed as being composed of a gate insulating film 1103, a gate electrode (a polycide structure composed of a polysilicon film 1104 and a tungsten silicide film 1105, for example) to serve as a word line, gate cap and gate sidewall films 1106 made of silicon nitride films, and a source/drain diffusion layer 1102.

An interlayer insulating film 1107 (silicon oxide film) formed as surrounding the MOS transistor is planarized, upon which more interlayer insulating films 1108 (silicon oxide film), 1109 (silicon nitride film) and 1110 (silicon oxide film) are formed.

Within these interlayer insulating films 1107, 1108, 1109 and 1110, a contact plug 1111 and a tungsten plug 1113, which connect the source/drain diffusion layer 1102 of the MOS transistor and a barrier layer 1114 of a capacitor, are formed. Furthermore, a diffusion preventing film (contact barrier film) 1112 is formed in way surrounding the tungsten plug 1113.

The capacitor is formed on the interlayer insulating film 1110. The capacitor is composed of a barrier layer (capacitor barrier film) 1114, a lower electrode 1115, a capacitor dielectric film 1116 and an upper electrode 1117, which are sequentially laminated.

Furthermore, a hydrogen preventing film 1118 made of an $AlO_x$ film, for instance, is formed in a way entirely surrounding the capacitor. An interlayer insulating film (silicon oxide film) 1120 is formed on the hydrogen preventing film 1118, and in the interlayer insulating film 1120, a contact 1119 for connecting with the upper electrode in the adjacent capacitor is formed.

The barrier layer 1114 has a laminated structure composed of a TiAl film 1114a and a TiAlN film 1114b, for instance.

The lower electrode 1115 includes an Ir film (noble metal film) 1115a and a plurality of SRO films (conductive oxide films) 1115b formed on the Ir film 1115a in an islands arrangement. The Ir film 1115a is about 30 nm thick.

The capacitor dielectric film 1116 is a PZT film. The upper electrode 1117 has a laminated structure composed of a SRO film 1117a and an $IrO_2$ film 1117b.

The PZT film 1116 is partially formed on the SRO films 1115b and the remaining portions of it are formed on the Ir film 1115a. Therefore, there are two laminated structures, one being a laminated structure of a PZT film and an Ir film and the other being a laminated structure of a PZT film and a SRO film.

By forming the PZT film on the SRO film, it is possible to have improved crystallizing ability with the PZT film, and improved imprint characteristic and retention characteristic (i.e. a deterioration behavior of retained amount of polarization). Accordingly, even when the Ir film 1115a is thinned, reliability of the semiconductor device will not be deteriorated. By thinning the Ir film 1115a, it is possible to prevent the capacitor from expanding in the horizontal direction, and thus, it is possible to reduce the capacitor size.

The contact structure of the SRO film and the PZT film will become a core of polarization inversion, which allows the switching voltage to be reduced, and the switching characteristic and the fatigue characteristic to be improved.

As in the case of the first embodiment, it is suitable that the coverage of the SRO films 1115b with respect to the upper surface of the Ir film 1115a is 20% or over but not exceeding 80%. More preferably, it is suitable that the coverage is 40% or over but not exceeding 60%.

FIG. 12 shows a relationship between a film thickness of the Ir film 1115a and a signal voltage Vsig, provided that the coverage of the SRO films 1115b is 50%. Here, the film thickness of the TiAlN film 1114b is set to 30 nm. As can be understood from the graph in FIG. 12, even when the Ir film 1115a is thinned, it is possible to keep the amount of reduction in the signal voltage Vsig to a small amount. Although it is suitable that the thickness of the Ir film 1115a is 20 nm to 40 nm, the Ir film 1115a can be thinned further down to a thickness of about 10 nm, because deterioration of the electric characteristic can still be prevented by having parts of it covered by the SRO films 1115b.

In this way, with respect to the semiconductor device according to the present embodiment of the invention, the interface portion between the lower electrode and the ferroelectric film will include two kinds of interfaces which are the interface of the noble metal film and the ferroelectric film, and the interface of the conductive oxide film and the ferroelectric film. Such arrangement will provide improved switching characteristic. Therefore, it is possible to reduce the capacitor size by thinning down the lower electrode, and at the same time, it possible to enhance the reliability of the capacitor.

Now a method of manufacturing the semiconductor device as described above will be described with reference to FIG. 13 to FIG. 19.

Figure 13:
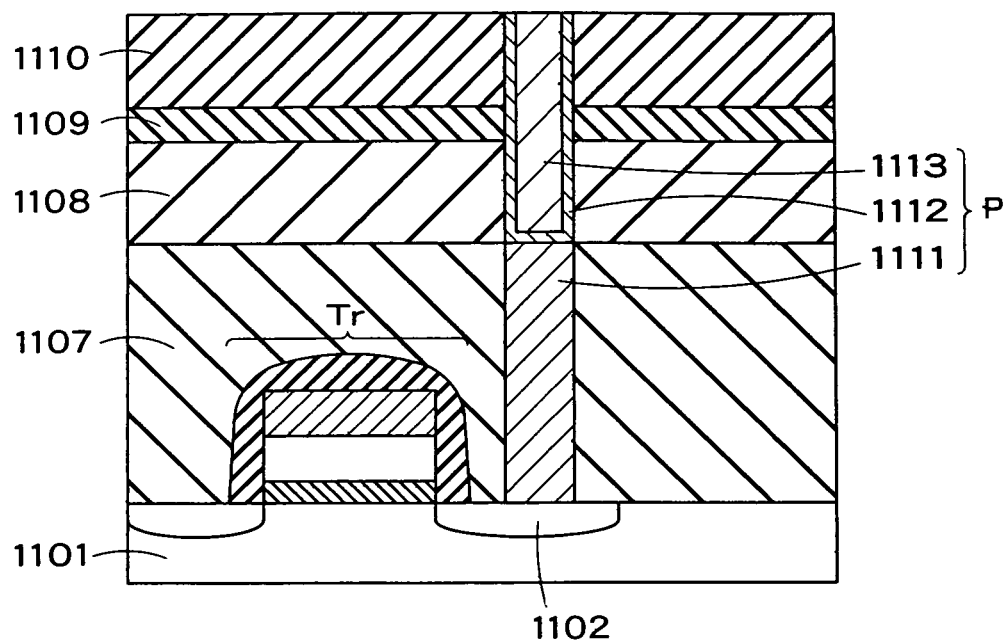
FIG. 13 is a sectional view explaining a manufacturing process in a method of manufacturing a semiconductor device according to the second embodiment of the present invention.

As shown in FIG. 13, a transistor Tr is to be formed on a silicon substrate 1101, using a heretofore known process, to form a CMOS structure. Then, a silicon oxide film 1107, a silicon oxide film 1108, a silicon nitride film 1109 and a silicon oxide film 1110 are to be deposited using a CVD (chemical vapor deposition) method and a CMP (chemical mechanical polishing) method, to form an interlayer insulating film.

At this point, a plug P is to be formed in advance since the connection between the capacitor and the active area (source/drain) of the transistor is to be made using plugs made of tungsten, polysilicon, or the like.

The plug P is formed as including a contact plug 1111, a tungsten plug 1113 and a contact barrier film 1112 which is formed in a way surrounding the tungsten plug 1113. In forming the plug P, a blanket CVD method and a CMP method are to be used in combination.

Figure 14:
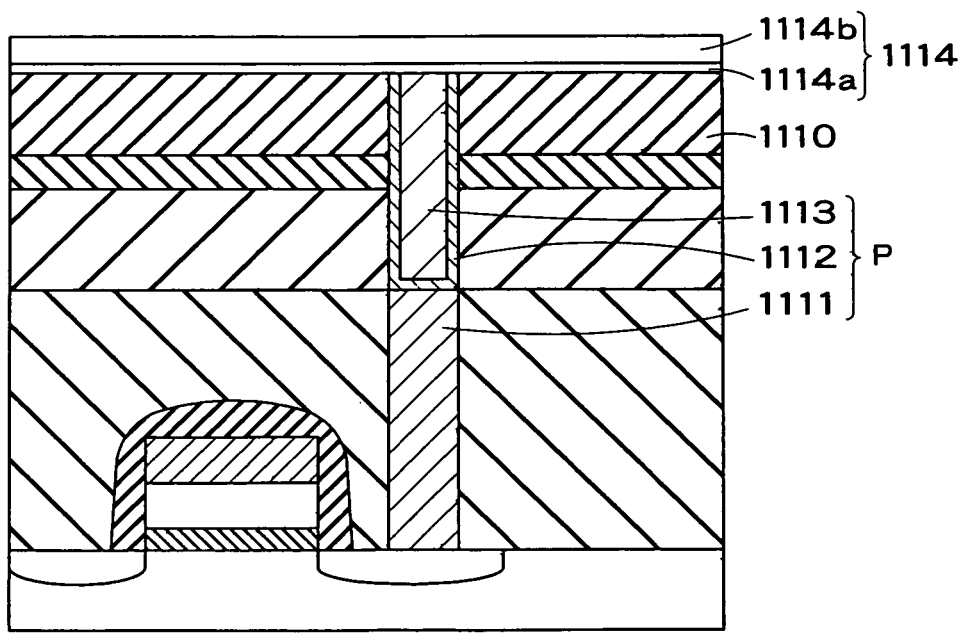
FIG. 14 is a sectional view showing a step subsequent to FIG. 13.

As shown in FIG. 14, a barrier metal layer 1114 is to be formed on the silicon oxide film 1110 and the plug P. The barrier metal layer 1114 has a laminated structure composed of a TiAl film 1114a and a TiAlN film 1114b. Using a DC magnetron sputtering method, the TiAl film 1114a is to be formed to a thickness of 5 nm and the TiAlN film 1114b is to be formed to a thickness of 30 nm.

The barrier metal layer 1114 functions to prevent the upper surface of the plug P from being oxidized due to an annealing process in an oxygen environment which is to be carried out for forming the ferroelectric film or for later securing the capacitor characteristic.

As shown in FIG. 15, an Ir film 1115a is to be formed to a thickness of 10 nm to 40 nm on the barrier metal layer 1114 by a sputtering method. In order to prevent hillock formation, the Ir film 1115a is to be formed by sputtering at a temperature of 300° C. or higher.

As shown in FIG. 16, SRO films 1115b are to be formed in an islands arrangement on the Ir film 1115a. In the formation of the SRO films 1115b, first, an amorphous film is to be formed by applying a sputtering power of 0.5 to 1 kW to a SRO ceramic target of 300 mm diameter, at a room temperature.

Next, by a RTP (rapid thermal process), the amorphous film is to have its temperature raised to 650° C. in an oxygen environment to be crystallized into a perovskite structure. At this time, the film will not be formed uniformly while its thickness is 10 nm or less, but become partially concentrated. By such process, the SRO films 1115b are to be formed in an islands arrangement.

It is also possible to form the SRO films 1115b in an islands arrangement by making the film thickness of the amorphous film 10 nm or less and gradually crystallizing the film at a substrate temperature of 600° C. or higher at the time of SRO sputtering.

Or else, the SRO film can be formed by sputtering at a room temperature, as described above, and kept in an amorphous state. In this case, the SRO will crystallize as the temperature rises at the time of forming the PZT film by MOCVD.

Normally, crystallization of the amorphous SRO film requires a thermal process at a temperature of 550° C. or higher in an environment including oxygen. In this case, however, the surface of the Ir film will also be subjected to oxidization at the same time. Therefore, by first forming the SRO film in an amorphous state, it is possible to have the surface of the Ir film not oxidized until when the PZT film is formed by MOCVD. In this case also, after the PZT film is formed, the SRO film on the Ir electrode will crystallize in an islands arrangement.

The coverage of the SRO films 1115b formed in an islands arrangement with respect to the upper surface of the Ir film 1115a can be controlled by a film thickness of the amorphous SRO film, while the coverage becomes larger as the film thickness increases. The coverage of the SRO films 1115b should become 20 to 80%.

As shown in FIG. 17, using a MOCVD method, a PZT film 1116 is to be formed to a thickness of 100 nm on a lower electrode 1115 composed of the Ir film 1115a and the SRO films 1115b formed in an islands arrangement. The PZT film formed on the Ir film 1115a by the MOCVD method has good crystallizing ability, and it is capable of preventing possible defects from being generated inside the film or at parts of the interface with the lower electrode.

For example, the PZT film can be formed by conducting liquid-supply MOCVD using THF as a solvent and Pb $(dpm)_2$/THF, Ti(iPr)$_2$(dpm)$_2$/THF, and Zr(iPr)$_2$(dpm)$_2$/THF as source materials. In this case, a film formation temperature should be 600° C. or higher and oxygen should be used as a reaction gas.

After the PZT film is formed, it is also possible to carry out a thermal process at a temperature of 400° C. to 600° C. in order to remove impurities such as carbon from the PZT film.

As shown in FIG. 18, an upper electrode 1117 is to be formed on the PZT film 1116. The upper electrode 1117 has a laminated structure composed of a SRO film 1117a and an IrO$_2$ film 1117b. In forming the upper electrode 1117, first, the SRO film 1117a is to be formed to a thickness of 10 nm by a DC magnetron sputtering method, after which a crystallizing thermal process is to be carried out.

Next, the IrO$_2$ film 1117b with a thickness of 80 nm is to be formed on the SRO film 1117a by a DC magnetron sputtering method.

After the IrO$_2$ film 1117b is formed, it is also possible to carry out a RTO (rapid thermal oxidation) process at a temperature of 500° C. By such thermal process, the IrO$_2$ film 1117b will be densified, and the resistance characteristic against reducible damage in a later wiring process can be improved.

As shown in FIG. 19, a capacitor structure is to be formed by conducting a RIE process with respect to the upper electrode 1117, the PZT film 1116, the lower electrode 1115 and the barrier metal layer 1114 using a hard mask (not shown).

Since carrying out the etching process on a noble metal electrode, etc. is difficult, the RIE process is to be conducted to give a taper such that no RIE residue will be left on the side surfaces of the capacitor. In the present embodiment of the invention, the lower electrode film (Ir film 1115a) is thinned down to the thickness of 10 nm to 40 nm, and therefore, it is possible to prevent the capacitor from expanding in the horizontal direction and thus reduce the capacitor size.

After the hard mask is removed, an AlO$_x$ film (e.g. an Al$_2$O$_3$ film) 1118 to be serving as a hydrogen preventing film is to be formed in way covering the capacitor structure.

After that, an interlayer insulating film (silicon oxide film) 1120 is to be formed, and a contact 1119 for connecting with the upper electrode in the adjacent capacitor is to be formed inside the interlayer insulating film 1120.

In this way, according to the present embodiment of the invention, it is possible to manufacture a semiconductor device having the lower electrode with a plurality of SRO films 1115b (conductive oxide films) being formed in an islands arrangement on the thinned Ir film (noble metal film) 1115a. Thereby, two kinds of laminated structures, one being a laminated structure composed of the noble metal film and the ferroelectric film and the other being a laminated structure composed of the conductive oxide film and the ferroelectric film, are formed in the interface portion between the lower electrode and the ferroelectric film. The laminated structure composed of the noble metal film and the ferroelectric film is capable of improving the crystallizing ability of the ferroelectric film, and the laminated structure composed of the conductive oxide film and the ferroelectric film is capable of reducing the coercive voltage and improving the fatigue and imprint characteristics. Furthermore, by thinning the Ir film 1115a, it is possible to reduce the capacitor size.

With the method of manufacturing a semiconductor device according to the present embodiment of the invention, it is possible to manufacture a semiconductor device which is small in size and has high reliability.

Third Embodiment

Manufacturing processes in a method of manufacturing a semiconductor device according to a third embodiment of the present invention are shown in FIG. 20 to FIG. 26.

As shown in FIG. 20, a transistor Tr is to be formed on a silicon substrate 2001, using a heretofore known process, to form a CMOS structure. Then, a silicon oxide film 2007, a silicon oxide film 2008, a silicon nitride film 2009 and a silicon oxide film 2010 are to be deposited using a CVD (chemical vapor deposition) method and a CMP (chemical mechanical polishing) method, to form an interlayer insulating film.

At this point, a plug P is to be formed in advance since the connection between the capacitor and the active area (source/drain) of the transistor is to be made using plugs made of tungsten, polysilicon, or the like.

The plug P is to be formed as including a contact plug 2011, a tungsten plug 2013 and a contact barrier film 2012 which is formed in a way surrounding the tungsten plug 2013. In forming the plug P, a blanket CVD method and a CMP method are to be used in combination.

The upper surface part of the plug P is to be recessed, and is to have a TiAlN film formed thereon. The TiAlN film is to be flattened by CMP while using the silicon oxide film 2010 as a stopper, by which a barrier metal film 2014 is to be formed. The barrier metal film 2014 functions to prevent the surface of the plug P from being oxidized in later processes of forming the ferroelectric film, etc.

At this point, it is also possible to bury TiAlN or Ir inside the recessed plug by a sputtering method, etc., and flatten the surface by CMP. By having a part of the lower electrode embedded inside the plug, it is possible to reduce the film thickness of the lower electrode in the capacitor.

Recessing of the plug P can be performed by using a wet etching method using a chemical, a dry etching process such as RIE, an etch-back process, or the like. Moreover, the TiAlN film can be formed by sputtering or CVD.

It is also possible to form the barrier metal film by forming a TiAlN film on the plug P and the silicon oxide film 2010 without the plug P being recessed, and removing the TiAlN film except for the part on the upper side of the plug P by RIE, etc.

As shown in FIG. 21, a silicon oxide film 2000 is to be formed on the silicon oxide film 2010 and the barrier metal film 2014 using a CVD method, for instance. Then, an opening (trench) 2030 is to be formed in such a way as to expose the upper surface of the barrier metal film 2014 using a lithography process and a RIE process.

As shown in FIG. 22, an Ir film 2015a is to be formed on the inner wall surface of the opening 2030. The Ir film 2015a should be formed by a method such as a MOCVD method or an ALD (atomic layer deposition) method. In forming the Ir film 2015a, it is also possible to use a sputtering method if the aspect ratio of the trench structure 2030 is small. In this case, however, it is necessary to form the Ir film to have sufficient thickness in order not to have inappropriate coverage. In this case, in order to prevent hillock formation, sputtering should be carried out at a high temperature of 300° C. or higher.

As shown in FIG. 23, SRO films 2015b are to be formed in an islands arrangement on the Ir film 2015a. In forming the SRO films 2015b, first, a SRO film is to be formed on the Ir film 2015a using an ALD method. Since the ALD method should form the film at a temperature lower than the crystallizing temperature, the SRO film will become an amorphous film, but it is possible to form the SRO film with uniform thickness and composition on the Ir film 2015a of the trench structure. The SRO film should be formed to a thickness of 10 nm or less, or more preferably, it should be formed to a thickness of about 3 to 7 nm.

By a RTP (rapid thermal process), this SRO film is to have its temperature raised to 650° C. in an oxygen environment to be crystallized into a perovskite structure. At this time, the film will not be formed to a film structure while its thickness is 10 nm or less, but will have a partially-concentrated structure. In this way, the SRO films 2015b in an islands arrangement can be formed uniformly on the Ir film 2015a.

The coverage of the SRO films 2015b with respect to the Ir film 2015a can be adjusted by a film thickness of the SRO film formed by the ALD method. As described with respect to the first embodiment, it is suitable that the coverage of the SRO films 2015b with respect to the Ir film 2015a is 20% or over but not exceeding 80%, or more preferably, it is suitable that the coverage is 40% or over but not exceeding 60%.

As shown in FIG. 24, using a MOCVD method, a PZT film 2016 is to be formed to a thickness of 100 nm on a lower electrode 2015 composed of the Ir film 2015a and the SRO films 2015b formed in an islands arrangement. The PZT film formed on the Ir film 2015a by the MOCVD method has good crystallizing ability, and it is capable of preventing possible defects from being generated inside the film or at parts of the interface with the lower electrode.

For example, the PZT film can be formed by conducting a liquid supply MOCVD using THF as a solvent and Pb $(dpm)_2$/THF, $Ti(iPr)_2(dpm)_2$/THF, and $Zr(iPr)_2(dpm)_2$/THF as source materials. In this case, a film formation temperature should be 600° C. or higher and oxygen should be used as a reaction gas. After the PZT film is formed, it is also possible to carry out a thermal process at a temperature of 400° C. to 600° C. in order to remove impurities such as carbon from the PZT film.

As shown in FIG. 25, a Pt film is to be formed on the PZT film 2016 using a sputtering method, etc., in order to form an upper electrode 2017. In stead of Pt, it is also possible to use a laminated structure of SRO and Pt, SRO, a laminated structure of SRO and $IrO_x$, a laminated structure of $IrO_x$ and Ir, Ir, Ru, $RuO_x$, or the like.

As shown in FIG. 25(a), the upper electrode 2017 can be formed in a way burying the trench underneath, or as shown in FIG. 25(b), it can be formed in a concave shape.

As shown in FIG. 26, a capacitor structure is to be formed by conducting a RIE process using a hard mask (not shown). After that, a hydrogen preventing film, an interlayer insulating film, a contact leading to the upper electrode 2017, and so forth are to be formed.

In this way, according to the present embodiment of the invention, it is possible to manufacture a three-dimensional structured semiconductor device (FeRAM) having the lower electrode with a plurality of SRO films (conductive oxide films) 2015b being formed in an islands arrangement on the Ir film (noble metal film) 2015a.

Therefore, two kinds of laminated structures, one being a laminated structure composed of the noble metal film and the ferroelectric film and the other being a laminated structure composed of the conductive oxide film and the ferroelectric film, will be formed in the interface portion between the lower electrode and the ferroelectric film. The laminated structure composed of the noble metal film and the ferroelectric film is capable of improving the crystallizing ability of the ferroelectric film, and the laminated structure composed of the conductive oxide film and the ferroelectric film is capable of reducing the coercive voltage and improving the fatigue and imprint characteristics.

Furthermore, since the conductive oxide films are formed using the ALD method, it is possible to have them formed with uniform thickness and composition on the noble metal film of the trench structure, by which the capacitor characteristic can be improved.

With the method of manufacturing a semiconductor device according to the present embodiment of the invention, it is possible to manufacture a semiconductor device which is small in size and has high reliability.

With respect to the present embodiment of the invention, although descriptions have been given of a concave type capacitor, it is also possible to have a convex type capacitor. One example of a method of manufacturing a convex type capacitor will be described.

As shown in FIG. 27, after a transistor Tr and a plug P are formed, a barrier metal film 3014 is to be formed on a silicon oxide film 2010 and the plug P. Next, an Ir film 3000 with a thickness of about 10 nm is to be formed on the barrier metal film 3014. After that, using a lithography process and a RIE process, the Ir film 3000 and the barrier metal film 3014 are to be removed except for the area on the upper side of the plug P.

As shown in FIG. 28, an Ir film is to be deposited using an electric field plating method to form an Ir film 3015a having a pillar structure.

In this case, instead of using the electric field plating method, it is also possible to form the Ir film 3015a having the same pillar structure by forming an Ir film on the barrier metal film 3014 and performing a RIE process on the Ir film.

As shown in FIG. 29, SRTO $(Sr(Ti, Ru)O_3)$ films 3015b are to be formed in an islands arrangement in away covering the Ir film 3015a. In forming the SRTO films 3015b, first, an amorphous SRTO film is to be formed to a thickness of 10 nm or less (e.g. 2 to 5 nm) using an ALD method. Next, this amorphous SRTO film is to be heated in a RTA process at a temperature of 550 to 650° C. in an oxygen environment to be crystallized into a perovskite structure and to be formed into the SRTO films 3015b in an islands arrangement.

As shown in FIG. 30, using a MOCVD method, a PZT film 3016 is to be formed to a thickness of 100 nm on a lower electrode 3015 composed of the Ir film 3015a and the SRTO films 3015b being formed in an islands arrangement. Next, an upper electrode 3017 is formed on the PZT film 3016. Then, a capacitor structure is to be formed by conducting a RIE process using a hard mask (not shown). After that, a hydrogen preventing film, an interlayer insulating film, a contact leading to the upper electrode 3017, and so forth are to be formed.

In this way, it is possible to manufacture a convex type capacitor which is small in size and has high reliability.

In the above-described embodiment, although SRO films or SRTO films have been used as the conductive oxide films formed in an islands arrangement, it is also possible to use LNO (LaNiO$_3$) films, YBCO films, or the like instead.

Moreover, although a PZT film is used as the ferroelectric film in the above-described embodiment, it is also possible to use SBT, SBT with Nb additive, BLT, PZT with various additives being added, a ferroelectric composite oxide such as PLZT, or the like, instead of PZT.

Furthermore, although an Ir film has been used as the noble metal film in the lower electrode in the above-described embodiment, it is also possible to use a different kind of noble metal such as Pt instead of Ir.

Fourth Embodiment

FIG. 31 shows a schematic structure of a semiconductor device according to a fourth embodiment of the present invention. On a semiconductor substrate 4101, an isolation (not shown) in a shape of a trench is formed, and a MOS transistor is formed to be composed of a gate insulating film 4103, a gate electrode (a polycide structure composed of a polysilicon film 4104 and a tungsten silicide film 4105, for example) to serve as a word line, gate cap and gate sidewall films 4106 made of silicon nitride films, and a source/drain diffusion layer 4102.

An interlayer insulating film 4107 (silicon oxide film) formed as surrounding the MOS transistor is planarized, upon which more interlayer insulating films 4108 (silicon oxide film), 4109 (silicon nitride film) and 4110 (silicon oxide film) are formed.

Within these interlayer insulating films 4107, 4108, 4109 and 4110, a contact plug 4111 and a tungsten plug 4113, which connect the source/drain diffusion layer 4102 of the MOS transistor and a barrier layer 4114 of a capacitor, are formed. Furthermore, a diffusion preventing film (contact barrier film) 4112 is formed in way surrounding the tungsten plug 4113.

The capacitor is formed on the interlayer insulating film 4110. The capacitor is composed of a barrier layer (capacitor barrier film) 4114, a lower electrode 4115, a capacitor dielectric film 4116 and an upper electrode 4117, which are sequentially laminated.

Furthermore, a hydrogen preventing film 4118 made of an AlO$_x$ film, for instance, is formed in a way entirely surrounding the capacitor. In an interlayer insulating film (silicon oxide film) 4120 formed on the hydrogen preventing film 4118, a contact 4119 for connecting with the upper electrode in the adjacent capacitor is formed.

The barrier layer 4114 is formed as including a TiAl film 4114a and a TiAlN film 4114b, for instance.

The lower electrode 4115 is an Ir film, for example. The capacitor dielectric film 4116 is a PZT film, for example.

The upper electrode 4117 has a laminated structure including a SRO film (ABO$_x$ perovskite type conductive oxide ("A" and "B" are metal elements, "O" is an oxygen element, and x>0)) 4117a, an IrO$_x$ film (MO$_x$ type conductive oxide ("M" is a metal element, "O" is an oxygen element, and x>0)) 4117b and an IrO$_x$ film 4117c, which are sequentially laminated.

The IrO$_x$ film 4117b has an IrO$_2$ crystal structure, and with respect to its elemental ratio, it is oxygen rich with the O/Ir ratio being 2 or greater. The density of the film is about 10.5 g/cm$^3$, and it is composed of microscopic particles each of which with a size of about 100 Å or less.

The IrO$_x$ film 4117c formed on the IrO$_x$ film 4117b has an IrO$_2$ crystal structure with high crystallizing ability. With respect to its composition, it is close to the stoichiometric composition, and the O/Ir ratio is about 2. In addition, the IrO$_x$ film 4117c has a dense microstructure while its density is higher than that of the IrO$_x$ film 4117b and is about 11.5 g/cm$^3$.

The IrO$_x$ film 4117b formed on the SRO film 4117a has high oxygen content, and therefore, it is capable of supplying sufficient oxygen to the SRO film 4117a portion or the interface between the SRO film 4117a and the PZT film 4116. Accordingly, it is possible to form the upper electrode as having few defects in the interface.

Therefore, it is possible to prevent possible deterioration in the amount of polarization, deterioration in the imprint characteristic and deterioration in the retention characteristic. Furthermore, possible reducible damage can be prevented as the IrO$_x$ film 4117c formed on the IrO$_x$ film 4117b can block out hydrogen intrusion that could occur in processes to be carried out in a hydrogen environment.

In this way, the semiconductor device according to the present embodiment of the invention can have improved resistance characteristic against processing damage and can achieve high reliability.

Now a method of manufacturing the semiconductor device as described above will be described with reference to FIG. 32 to FIG. 37.

As shown in FIG. 32, a transistor T is to be formed on a silicon substrate 4201, using a heretofore known process, to form a CMOS structure. Then, a silicon oxide film 4202, a silicon oxide film 4203, a silicon nitride film 4204 and a silicon oxide film 4205 are to be deposited using a CVD (chemical vapor deposition) method and a CMP (chemical mechanical polishing) method, to form an interlayer insulating film.

At this point, a plug 4206 is to be formed in advance since the connection between the capacitor and the active area (source/drain) of the transistor is to be made using plugs made of tungsten, polysilicon, or the like.

The plug 4206 is to be formed as including a contact plug 4207, a tungsten plug 4208 and a contact barrier film 4209 which is formed in a way surrounding the tungsten plug 4208. In forming the plug 4206, a blanket CVD method and a CMP method are used in combination.

As shown in FIG. 33, a barrier metal layer 4300 is to be formed on the silicon oxide film 4205 and the plug 4206. The barrier metal layer 4300 has a laminated structure composed of a TiAl film 4301 and a TiAlN film 4302. Using a DC magnetron sputtering method, the TiAl film 4301 is to be formed to a thickness of 5 nm and the TiAlN film 4302 is to be formed to a thickness of 30 nm.

The barrier metal layer 4300 functions to prevent the surface of the plug 4206 from being oxidized due to an annealing process in an oxygen environment which is to be carried out for forming the ferroelectric film or for later securing the capacitor characteristic.

As shown in FIG. 34, an Ir film 4401 which is to become a lower electrode is to be formed to a thickness of 100 nm on the barrier metal layer 4300 by a sputtering method.

As shown in FIG. 35, a PZT film 4501 which is to become a capacitor dielectric film is to be formed to a thickness of 100 nm on the Ir film 4401 by a sputtering method. In this case, an RF magnetron sputtering method is to be used. In this process, a PZT ceramic target with the amount of Pb increased by 10% will be used. The composition of the target is Pb$_{1.10}$La$_{0.05}$Zr$_{0.4}$Ti$_{0.6}$O$_3$.

With respect to the PZT ceramic target, one with high density realizes high sputtering speed and exhibits good environmental tolerance with respect to moisture and so forth. Therefore, a ceramic sintered body with a theoretical density of 98% or over is to be used.

At the time of sputtering, the substrate temperature could be elevated due to plasma, or bombardment by flying particles could be expected. Due to such factors, Pb could be evaporated from the Si substrate or re-sputtering of the Pb could happen, and therefore, a loss in the amount of Pb within the film could easily occur.

The excess Pb is added to the target so that it could compensate for the possible loss of Pb and promote crystallization of the PZT film 4501 at the time of RTA (rapid thermal annealing). The elements such as Zr, Ti, La, or the like should be taken up by the film in nearly the same proportion as in the target composition. Therefore, a target with desirable amount proportion of composition should be used.

Then by using RTA, the PZT film 4501 is to be crystallized.

As shown in FIG. 36, an upper electrode 4600 is to be formed on the PZT film 4501. The upper electrode 4600 is to be formed as having a laminated structure composed of a SRO film 4601, an $IrO_x$ film 4602 and an $IrO_2$ film 4603.

With respect to the upper electrode 4600, first, DC magnetron sputtering is to be performed on a SRO ceramic target of 300 mm diameter under the conditions of sputtering; with a sputtering power of 1 kW, at a room temperature, at a pressure of 0.5 Pa, in a mixed gas of argon and oxygen, and with an oxygen flow rate of 50%, so as to form the SRO film 4601 to a film thickness of 10 nm.

After the SRO film 4601 is formed, a crystallizing process is to be performed at a temperature of 550 to 650° C. by RTO (rapid thermal oxidation), etc.

Next, DC magnetron sputtering is to be performed on an Ir target of 300 mm diameter under the conditions of sputtering; with a sputtering power of 0.2 kW, at a room temperature, at a pressure of 0.5 Pa, and in a mixed gas of argon and oxygen ($Ar/O_2=20/80$), so as to form the $IrO_x$ film 4602 to a film thickness of 30 nm.

The $IrO_x$ film 4602 should be formed by sputtering under high oxygen density (high oxygen partial pressure) and low sputtering power density to become oxygen rich. Preferably, the sputtering power density should be 0.1 to 1 $W/cm^2$, and the $O_2$ flow rate in the total sputtering gas flow should be 50% or over but less than 100%.

When the sputtering power density is less than 0.1 $W/cm^2$, electric discharge will not occur stably, and the film formation speed will become extremely slow, and thus, such condition is not practical.

On the other hand, when the sputtering power density is greater than 1 $W/cm^2$, particle size of the sputtered particles will become larger, and at the same time, it becomes necessary to introduce a large amount of oxygen in order to form an oxygen rich $IrO_x$ film. This leads to a problem of magnifying variation in the film characteristic (film thickness, resistance, etc.).

Next, the $IrO_2$ film 4603 is to be formed with higher sputtering power and less amount of oxygen as compared to the case of forming the $IrO_x$ film 4602. For instance, DC magnetron sputtering is to be performed on an Ir target of 300 mm diameter under the conditions of sputtering; with a sputtering power of 2 kW, at a room temperature, at a pressure of 0.5 Pa, and in a mixed gas of argon and oxygen ($Ar/O_2=50/50$), so as to form the $IrO_2$ film 4603 to a film thickness of 50 nm.

After thermal processing, the $IrO_x$ film 4602 will have an $IrO_2$ crystal structure, and the elemental ratio will be oxygen rich as the O/Ir ratio will be 2 or greater. On the other hand, after thermal processing, the $IrO_2$ film 4603 will have an $IrO_2$ crystal structure with high crystallizing ability, and with respect to its composition, it will be close to the stoichiometric composition, and the O/Ir ratio will be about 2. In addition, the $IrO_2$ film 4603 will have a dense microstructure and be higher in density as compared to the $IrO_x$ film 4602.

As shown in FIG. 37, a capacitor structure is to be formed by conducting a RIE process with respect to the upper electrode 4600, the PZT film 4501, the Ir film 4401 and the barrier metal layer 4300 using a hard mask (not shown). After the mask is removed, an $AlO_x$ film (e.g. an $Al_2O_3$ film) 4701 to be serving as a hydrogen preventing film is to be formed in way covering the capacitor structure.

After that, an interlayer insulating film (silicon oxide film) 4702 is to be formed, and a contact 4703 for connecting with the upper electrode in the adjacent capacitor is to be formed inside the interlayer insulating film 4702.

The $IrO_x$ film 4602 has high oxygen content, and therefore, it is capable of supplying sufficient oxygen to the SRO film 4601 portion or the interface between the SRO film 4601 and the PZT film 4501. Furthermore, since the sputtering power used in forming the film is low, it is possible to keep possible sputtering damage due to element implantation, etc. with respect to the SRO film 4601 small. Thereby, it is possible to prevent possible defects from being generated in the interface between the ferroelectric film and the upper electrode.

In addition, the $IrO_2$ film 4603 having a dense microstructure is capable of preventing capacitor deterioration and hydrogen diffusion that can be caused by the hard mask CVD film forming process, RIE process in capacitor processing, and reducible annealing.

In this way, it is possible to manufacture a semiconductor device having improved resistance characteristic against processing damage and having high reliability.

As shown in FIG. 38, the upper electrode 4117 can also be formed as having a laminated structure composed of an $IrO_x$ film 4117b and an $IrO_2$ film 4117c, without including the SRO film. The $IrO_x$ film 4117b should have an $IrO_2$ crystal structure, and with respect to its elemental ratio, it is oxygen rich with the O/Ir ratio being 2 or greater. The $IrO_2$ film 4117c should have an $IrO_2$ crystal structure with high crystallizing ability, and with respect to its composition, it is close to the stoichiometric composition, and the O/Ir ratio is about 2. In addition, the $IrO_2$ film 4117c should have a dense microstructure and should be higher in density as compared to the $IrO_x$ film 4117b.

Since the $IrO_x$ film 4117b being oxygen rich is formed on the PZT film 4116, sufficient amount of oxygen can be supplied to the interface between the PZT film 4116 and the upper electrode 4117. Accordingly, it is possible to prevent possible defects such as oxygen loss from being generated, and therefore, it is possible to realize a semiconductor device with high reliability.

In the present embodiment of the invention, although $IrO_x$ has been used as the $MO_x$ type conductive oxide in the upper electrode, it is also possible to use $RuO_x$, $OsO_x$, $RhO_x$, or $PdO_x$ instead.

Furthermore, with respect to the $ABO_x$ type conductive oxide, other than SRO ($SrRuO_3$), it is also possible to use LNO ($LaNiO_3$), LSCO (($La, Sr)CoO_3$), YBCO (superconductor), or the like.

In the present embodiment of the invention, as shown in FIG. 35, the PZT film to be serving as the capacitor dielectric film has been formed using a sputtering method. However, it is also possible to form the PZT film using a MOCVD method. The MOCVD method is advantageous in a way such that it proves good step coverage with respect to electrode structure, it has superior composition controllability, it can uniformly form a high-quality film on a large area, it has high film formation speed, it is capable of thinning the ferroelectric film (it is capable of low-voltage operation), and so forth.

With respect to the source materials of PZT to be used in the MOCVD method, typical ones are; Pb(dpm)$_2$ as a Pb source, Zr(dpm)$_4$ or Zr(O–tC$_4$H$_9$)$_4$ as a Zr source, Ti(O–iC$_3$H$_7$)$_4$ or Ti(O–iC$_3$H$_7$)$_2$(dpm)$_2$ as a Ti source, and so forth. These source materials are mixed with THF (tetrahydrofuran) or butyl acetate to be used in a solution vaporization method.

Vaporization of the source materials is to be performed by a vaporizer, which comes in a great variety of kinds such as; a kind that atomizes a solution by ultrasonic wave, a kind that spraying a solution on a hot plate, a kind that uses an atomizer, and so forth.

With respect to the substrate temperature, a temperature of around 600° C. is appropriate, although it depends on the source materials to be used. In this process, N$_2$O or O$_2$ is to be supplied as an oxidizing agent at the same time. Crystallization will occur in situ, and a PZT<111> oriented crystal film will be formed on the Ir film 4401.

Moreover, after the IrO$_2$ film 4603 is formed, it is also possible to conduct a RTO process at a temperature of 500° C. By this process, the IrO$_2$ film 4603 can be made denser and prove further improved suppressive effect against reducible damage.

The above-described first to fourth embodiments of the present invention can be combined where appropriate. For instance, by combining the first embodiment and the fourth embodiment, a semiconductor device as shown in FIG. 39 can be obtained.

In this case, a lower electrode 5115 includes an Ir film (noble metal film) 5115*a* and a plurality of SRO films (conductive oxide films) 5115*b* formed on the Ir film 5115*a* in an islands arrangement. Therefore, the interface portion between the lower electrode 5115 and a ferroelectric film 5116 will include two kinds of interfaces, one being the interface of the noble metal film and the ferroelectric film and the other being the interface of the conductive oxide film and the ferroelectric film. With this structure, it is possible to improve the switching characteristic.

An upper electrode 5117 has a laminated structure including a SRO film 5117*a*, an IrO$_x$ film 5117*b* and an IrO$_x$ film 5117*c*, which are sequentially laminated.

The IrO$_x$ film 5117*b* has an IrO$_2$ crystal structure, and with respect to its elemental ratio, it is oxygen rich with the O/Ir ratio being 2 or greater. The density of the film is about 10.5 g/cm$^3$, and it is composed of microscopic particles each of which with a size of about 100 Å or less.

The IrO$_x$ film 5117*c* formed on the IrO$_x$ film 5117*b* has an IrO$_2$ crystal structure with high crystallizing ability. With respect to its composition, it is close to the stoichiometric composition, and the O/Ir ratio is about 2. In addition, the IrO$_x$ film 5117*c* has a dense microstructure while its density is higher than that of the IrO$_x$ film 5117*b* and is about 11.5 g/cm$^3$.

The IrO$_x$ film 5117*b* formed on the SRO film 5117*a* has high oxygen content, and therefore, it is capable of supplying sufficient oxygen to the SRO film 5117*a* portion or the interface between the SRO film 5117*a* and the ferroelectric film 5116. Accordingly, it is possible to form the upper electrode as having few defects in the interface.

Therefore, it is possible to prevent possible deterioration in the amount of polarization, deterioration in the imprint characteristic and deterioration in the retention characteristic. Furthermore, possible reducible damage can be prevented as the IrO$_x$ film 5117*c* formed on the IrO$_x$ film 5117*b* can block out hydrogen intrusion that could occur in processes to be carried out in a hydrogen environment.

In this way, the semiconductor device according to the combination of the first embodiment and the fourth embodiment of the present invention can have improved switching characteristic and resistance characteristic against processing damage, and can achieve high reliability.

Figure 40:
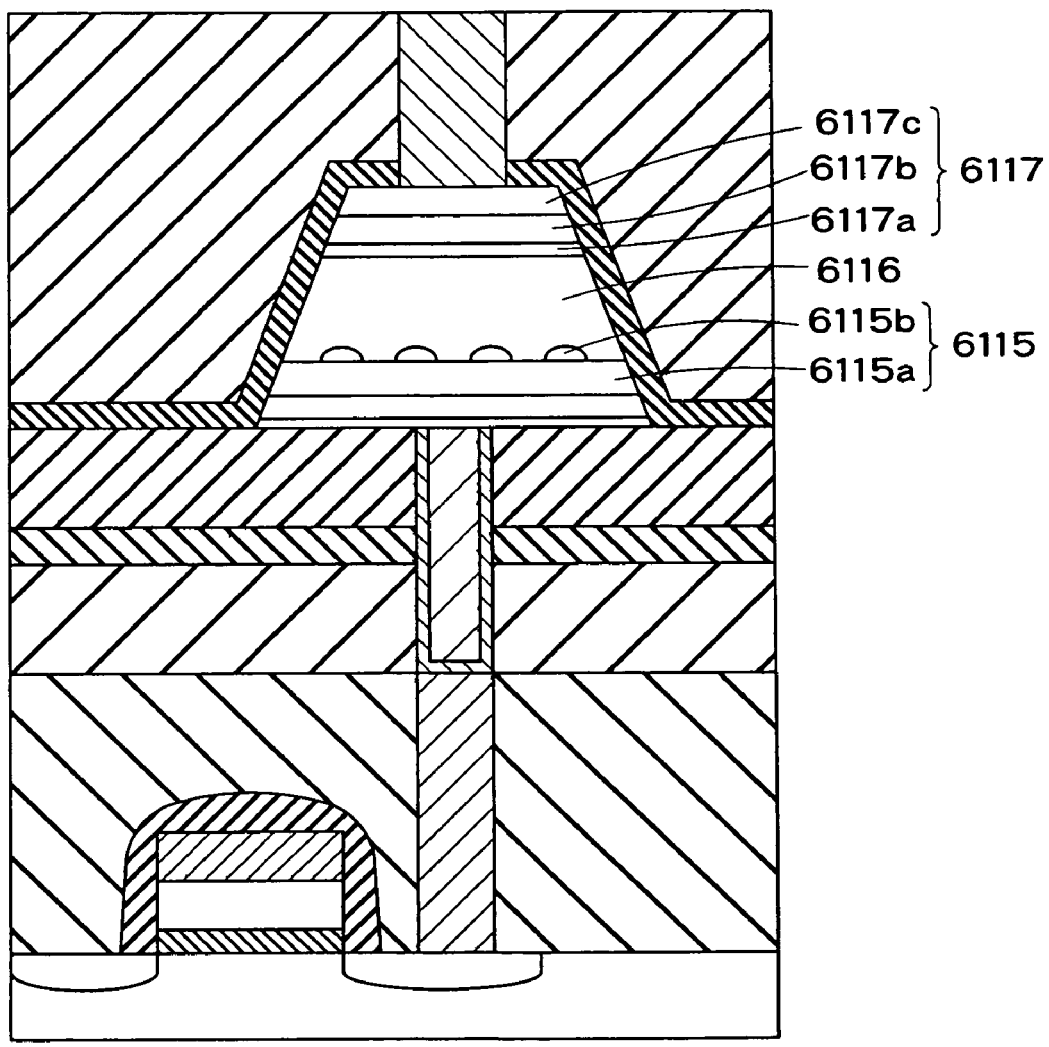
FIG. 40 is a schematic structure diagram of a semiconductor device according to a variant of the present invention.

Moreover, for instance, it is also possible to combine the second embodiment and the fourth embodiment of the invention to manufacture a semiconductor device as shown in FIG. 40.

In this case, a lower electrode 6115 includes a thinned Ir film (noble metal film) 6115*a* and a plurality of SRO films (conductive oxide films) 6115*b* formed on the Ir film 6115*a* in an islands arrangement. Therefore, it is possible to improve the switching characteristic, and at the same time, it is possible to prevent the capacitor from expanding in the horizontal direction, and thus reduce the capacitor size.

An IrO$_x$ film 6117*b* in an upper electrode 6117 has high oxygen content, and therefore, it is capable of supplying sufficient oxygen to a SRO film 6117*a* portion or the interface between the SRO film 6117*a* and a ferroelectric film 6116.

An IrO$_x$ film 6117*c* formed on the IrO$_x$ film 6117*b* has an IrO$_2$ crystal structure with high crystallizing ability, and it has a dense microstructure. Therefore, the IrO$_x$ film 6117*c* is capable of blocking out hydrogen intrusion that could occur in processes to be carried out in a hydrogen environment, and thus preventing reducible damage.

In this way, the semiconductor device according to the combination of the second embodiment and the fourth embodiment of the present invention can have improved switching characteristic and resistance characteristic against processing damage, achieve high reliability, and have a reduced size of capacitor.

What is claimed is:

1. A method of manufacturing a semiconductor device, comprising:
    forming a noble metal film, which is to become a part of a lower electrode, on the upper side of a semiconductor substrate, the lower electrode being a component of a capacitor;
    forming a conductive oxide film to a film thickness of 10 nm or less on the noble metal film;
    processing the conductive oxide film into a plurality of films in an islands arrangement;
    forming a dielectric film, which is a component of the capacitor, on the noble metal film and the plurality of conductive oxide films formed in an islands arrangement, using a MOCVD method; and
    forming an upper electrode, which is a component of the capacitor, on the dielectric film, wherein
    the conductive oxide films are SRO (SrRuO$_3$) films and the noble metal film is an Ir film.

2. The method of manufacturing a semiconductor device according to claim 1, further comprising:
    forming an insulating film on the upper side of the semiconductor substrate and a trench in that insulating film, prior to forming the noble metal film; and
    forming the noble metal film on the bottom surface and sidewall of the trench.

3. The method of manufacturing a semiconductor device according to claim 2, further comprising:
    forming the conductive oxide film on the noble metal film into an amorphous state with a film thickness of 10 nm or less using an ALD method; and
    processing the conductive oxide film into a plurality of films in an islands arrangement by crystallizing the conductive oxide film by heating.

4. The method of manufacturing a semiconductor device according to claim 1, further comprising:
forming the noble metal film on a predetermined area on the upper side of the semiconductor substrate;
forming the conductive oxide film on the surface of the noble metal film into an amorphous state with a film thickness of 10 nm or less using an ALD method; and
processing the conductive oxide film into a plurality of films in an islands arrangement by crystallizing the conductive oxide film by heating.

* * * * *